(12) United States Patent
Sumant et al.

(10) Patent No.: US 9,696,222 B2
(45) Date of Patent: Jul. 4, 2017

(54) PIEZORESISTIVE BORON DOPED DIAMOND NANOWIRE

(71) Applicant: UCHICAGO ARGONNE, LLC, Chicago, IL (US)

(72) Inventors: Anirudha V. Sumant, Plainfield, IL (US); Xinpeng Wang, Franklin Park, NJ (US)

(73) Assignee: UCHICAGO ARGONNE, LLC, Chicago, IL (US)

( * ) Notice: Subject to any disclaimer, the term of this patent is extended or adjusted under 35 U.S.C. 154(b) by 0 days.

(21) Appl. No.: 15/231,421

(22) Filed: Aug. 8, 2016

(65) Prior Publication Data

US 2016/0349125 A1 Dec. 1, 2016

Related U.S. Application Data

(62) Division of application No. 14/601,908, filed on Jan. 21, 2015, now Pat. No. 9,441,940.

(51) Int. Cl.

| | |
|---|---|
| *H01L 21/00* | (2006.01) |
| *G01L 1/18* | (2006.01) |
| *H01L 29/04* | (2006.01) |
| *H01L 29/16* | (2006.01) |
| *H01L 21/04* | (2006.01) |
| *H01L 21/308* | (2006.01) |
| *G01B 7/14* | (2006.01) |
| *H01L 29/06* | (2006.01) |

(Continued)

(52) U.S. Cl.
CPC ............. *G01L 1/18* (2013.01); *G01B 7/14* (2013.01); *H01L 21/042* (2013.01); *H01L 21/043* (2013.01); *H01L 21/308* (2013.01); *H01L 29/04* (2013.01); *H01L 29/0669* (2013.01); *H01L 29/0673* (2013.01); *H01L 29/1602* (2013.01); *H01L 29/167* (2013.01); *G01B 7/18* (2013.01)

(58) Field of Classification Search
CPC ..... G01L 1/18; H01L 29/0669; H01L 29/167; H01L 29/0673
USPC .................................................. 438/105
See application file for complete search history.

(56) References Cited

U.S. PATENT DOCUMENTS

| | | |
|---|---|---|
| 5,183,530 A | 2/1993 | Yamazaki |
| 5,622,902 A | 4/1997 | Kurtz et al. |
| 6,340,393 B1 | 1/2002 | Yoshida |

(Continued)

OTHER PUBLICATIONS

American Institute of Physics, Scientists Carve Nanowire Out of Ultrananosrystalline Diamond Thin Films, Nov. 4, 2011, 1 page.

(Continued)

*Primary Examiner* — Anthony Ho
(74) *Attorney, Agent, or Firm* — Foley & Lardner LLP

(57) ABSTRACT

A UNCD nanowire comprises a first end electrically coupled to a first contact pad which is disposed on a substrate. A second end is electrically coupled to a second contact pad also disposed on the substrate. The UNCD nanowire is doped with a dopant and disposed over the substrate. The UNCD nanowire is movable between a first configuration in which no force is exerted on the UNCD nanowire and a second configuration in which the UNCD nanowire bends about the first end and the second end in response to a force. The UNCD nanowire has a first resistance in the first configuration and a second resistance in the second configuration which is different from the first resistance. The UNCD nanowire is structured to have a gauge factor of at least about 70, for example, in the range of about 70 to about 1,800.

17 Claims, 16 Drawing Sheets

(51) Int. Cl.
H01L 29/167 (2006.01)
G01B 7/16 (2006.01)

(56) References Cited

U.S. PATENT DOCUMENTS

| | | |
|---|---|---|
| 7,781,257 B2 | 8/2010 | Taylor |
| 8,354,290 B2 | 1/2013 | Sumant et al. |
| 8,420,043 B2 | 4/2013 | Gamo et al. |
| 2002/0041154 A1 | 4/2002 | Tomasetti et al. |
| 2003/0001498 A1 | 1/2003 | Niigaki et al. |
| 2004/0129202 A1 | 7/2004 | Gruen et al. |
| 2004/0221795 A1 | 11/2004 | Scarsbrook et al. |
| 2007/0057261 A1 | 3/2007 | Jeong et al. |
| 2008/0134960 A1 | 6/2008 | Kasu et al. |
| 2009/0124025 A1 | 5/2009 | Hamilton et al. |
| 2009/0239078 A1 | 9/2009 | Asmussen et al. |
| 2010/0052112 A1 | 3/2010 | Rogers et al. |
| 2010/0189924 A1 | 7/2010 | D'Evelyn et al. |
| 2013/0026492 A1 | 1/2013 | Khan |
| 2013/0082241 A1 | 4/2013 | Kub et al. |
| 2013/0145857 A1 | 6/2013 | Bryant et al. |
| 2013/0320295 A1 | 12/2013 | Rao et al. |
| 2013/0333094 A1 | 12/2013 | Rogers et al. |
| 2015/0092925 A1 | 4/2015 | Stoupin et al. |

OTHER PUBLICATIONS

Aslam et al., "Piezorsistivity in vapor-deposited diamond films," Applied Physics Letters, vol. 60, Issue 23, Jun. 8, 1992, 3 pages.
Baryshev et al., "Planar ultrananocrystalline diamond field emitter in accelerator radio frequency electron injector: Performance metrics," Applied Physics Letters, vol. 105, No. 203505 Nov. 18, 2014, pp. 203505-1-203505-5.
Butler et al., "The CVD of Nanodiamond Materials," Chemical Vapor Deposition, vol. 14, Aug. 15, 2008, 16 pages.
Dai et al., "Optically Transparent Diamond Electrode for Use in IR Transmission Spectroelectrochemical Measurements", Analytical Chemistry, vol. 79, No. 19, Oct. 1, 2007, 8 pages.
Fischetti et al., Band structure, deformation potentials, and carrier mobility in strained Si, Ge, and SiGe alloys, Journal of Applied Physics, vol. 80, No. 4, Aug. 15, 1996, 19 pages.
Gaowei, Responsive Study of Diamond X-Ray Monitors with nUNCD Contact Proc. of IPAC 2015, Jun. 2015, pp. 1273-1275.
Goyal et al., "Direct Low-Temperature Integration of Nanocrystalline Diamond with GaN Substrates for Improved Thermal Management of High-Power Electronics", Advanced Functional Materials Journal, Feb. 1, 2012, 22, 1525-1530.
Grimes, A Prototype Diamond Amplified Photocathode, Master of Science Thesis, Stony Brook University, May 2007, pp. ii-102.
Gruen et al., "Configurational, electronic entropies and the thermoelectric properties of nanocarbon ensembles," Applied Physics Letters, vol. 92, Issue 14, No. 143118, Apr. 11, 2008, 3 pages.
He et al., "Giant piezoresistance effect in silicon nanowires," Nature Nanotechnology, vol. 1, Oct. 2006, 5 pages.
Ieong et al., "Silicon Device Scaling to the Sub-10-nm Regime," Science, vol. 306, Dec. 17, 2004, 4 pages.
Kulha et al., Design and Fabrication of Piezoresistive Strain Gauges Based on Nanocrystalline Diamond Layers, 2011, 4 pages.
Perez et al., "High quantum efficiency ultrananocrystalline diamond photocathode for photoinjector applications," Applied Physics Letters, vol. 105 Sep. 22, 2014, pp. 123103-1-123103-4.
Rameau et al., "Properties of Hydrogen Terminated Diamond As a Photocathode", Physical Review Letters, Abstract, vol. 106, Issue 137602, Mar. 30, 2011, 4 pages.
Stotter et al., "Optical and Electrochemical Properties of Optically Transparent, Boron-Doped Diamond Thin Films Deposited on Quartz" Analytical Chemistry, vol. 74, No. 23, Dec. 1, 2002, 7 pages.
Sumant et al., "High Quantum Efficiency Photocathodes Based on Ultrananocrystalline Diamond Operating Between 250 nm and Visible Blue", Slide Presentation, by Argonne and U.S. Department of Energy, Nov. 24, 2014,p. 1-7.
Tremsin & Siegmund, "Polycrystalline diamond films as prospective UV photocathodes," Proceedings SPIE, vol. 4139, Dec. 18, 2000, pp. 1-9.
Wang et al., Piezoresistivity of Polycrystalline P-type Diamond Films of Various Doping Levels at Different Temperatures, Jul. 15, 1997, 5 pages.
Werner et al., "Review on diamond based piezoresistive sensors." Industrial Electronics, Jul. 1998, IEEE International Symposium, vol. 1, 6 pages.
Ex Parte Quayle Action for U.S. Appl. No. 14/601,908, mailed Mar. 30, 2016, 9 pages.
Notice of Allowance for U.S. Appl. No. 14/790,995, mailed Jun. 24, 2016, 12 pages.
Notice of Allowance for U.S. Appl. No. 14/790,995, mailed Jun. 24, 2016, 16 pages.
Notice of Allowance on U.S. Appl. No. 14/594,949, mailed Jul. 13, 2016, 3 pages.
Notice of Allowance on U.S. Appl. No. 14/601,908, mailed May 9, 2016, 7 pages.
Search Report and Written Opinion for International Application No. PCT/US2016/013708, mail date Jul. 28, 2016, 11 pages.
Search Report for International Application No. PCT/US2016/040456, mail date Nov. 4, 2016, 4 pages.
Office Action for U.S. Appl. No. 14/796,527, mail date Sep. 13, 2016, 6 pages.
Notice of Allowance for U.S. Appl. No. 14/790,995, mail date Oct. 5, 2016, 3 pages.

PIEZORESISTIVE BORON DOPED DIAMOND NANOWIRE

CROSS-REFERENCE TO RELATED APPLICATION

This application is a divisional of U.S. patent application Ser. No. 14/601,908, filed Jan. 21, 2015, which is incorporated herein by reference in its entirety.

The United States Government claims certain rights in this invention pursuant to Contract No. W-31-109-ENG-38 between the United States Government and the University of Chicago and/or pursuant to DE-AC02-06CH11357 between the United States Government and UChicago Argonne, LLC representing Argonne National Laboratory.

TECHNICAL FIELD

The present disclosure relates generally to methods of fabricating piezoresistive sensors.

BACKGROUND

Piezoresistive materials experience a change in one or more electrical properties of the material when subjected to a strain. For example, the effect of strain on silicon (Si) and germanium (Ge) was discovered in the 1950s. It was found that strain on these materials can result in the modification of several electrical properties of the materials such as band gap, carrier mobility and so on. As a result, the resistance or otherwise resistivity of the material is also altered because of the strain. This effect is known as piezoresistivity or piezoresistance (PZR) effect.

This property of piezoresistive materials has found widespread applications in Micro Electro Mechanical Systems (MEMS) sensor systems, particularly as displacement sensors and force sensors. Even small forces on such PZR sensors can produce strain and thereby a measurable change in the resistance or otherwise resistivity of such devices. This change in resistance or otherwise resistivity can be correlated to the displacement of the piezoresistive material and/or the amount of force exerted on the piezoresistive material. Another application involves intentionally applying strain on transistors to enhance carrier mobility and improve the transistor's performance.

The most common material used for fabricating PZR devices includes Si. State-of-the-art PZR devices include Si nanowires which are generally manufactured using a chemical vapor deposition (CVD) process. A PZR coefficient of such silicon nanowires is higher than bulk silicon by a factor of about 2. Although such Si nanowires have shown great promise in sensing applications (e.g., force sensing, and bio sensing applications) which use the PZR effect of the Si nanowires for sensing, strong and rapid oxidation of the Si nanowires impacts the performance of such sensors. Oxidation of the Si nanowires can change the mechanical properties (e.g., moment of inertia, strain, etc.) and/or electrical properties (e.g., resistivity) of the Si nanowires thereby affecting measurements. Furthermore, the Si nanowires are known to lose their functionality at temperatures higher than about 300 degrees Celsius, which has limited the widespread use of such Si nanowires as force sensors.

SUMMARY

Embodiments described herein relate generally relate to methods of fabricating PZR sensors, and in particular to methods of fabricating PZR boron doped ultrananocrystalline diamond (UNCD) nanowires and displacement sensors formed therefrom.

In some embodiments, an UNCD nanowire comprises a first end electrically coupled to a first contact pad which is disposed on a substrate. A second end of the UNCD nanowire is electrically coupled to a second contact pad which is also disposed on the substrate. The UNCD nanowire is doped with a dopant. The UNCD nanowire is disposed over the substrate. Furthermore, the UNCD nanowire is movable between a first configuration in which no force is exerted on the UNCD nanowire and a second configuration in which the UNCD nanowire bends about the first end and the second end in response to a force. The UNCD nanowire has a first resistance in the first configuration and a second resistance in the second configuration which is different from the first resistance. The UNCD nanowire is structured to have a gauge factor of at least about 70. In particular embodiments, the gauge factor of the ultrananocrystalline diamond nanowire is in the range of about 70 to about 1,800.

In some embodiments, a displacement sensor comprises a boron doped diamond nanowire disposed on a substrate. The boron doped diamond nanowire has a first end and a second end. The first end is coupled to a first contact pad disposed on a substrate. The second end is coupled to a second contact pad also disposed on the substrate. The boron doped diamond nanowire is movable between a first configuration and a second configuration. In the first configuration, no force is exerted on the boron doped diamond nanowire and the boron doped nanowire has a first electrical parameter. In the second configuration the boron doped nanowire bends about the first end and the second end in response to a force such that the boron doped nanowire has a second electrical parameter in the second configuration which is different than the first electrical parameter. Moreover, the boron doped diamond nanowire is structured to have a gauge factor of at least about 70. In particular embodiments, the boron doped diamond nanowire has a gauge factor in the range of about 70 to about 1,800. In other embodiments, the electrical parameter is resistance. In one embodiment, the boron doped diamond nanowire includes a boron doped UNCD (B-UNCD) nanowire.

In some embodiments, a method for preparing a piezoresistive B-UNCD nanowire comprises depositing a metal layer on a B-UNCD film. The B-UNCD film is disposed on a sacrificial layer which is disposed on a substrate. The metal layer is patterned to form contact pads which are disposed on the B-UNCD film. A first masking layer is deposited on the B-UNCD film. A second masking layer is deposited over the first masking layer. The first masking layer and the second masking layer are patterned to define an etch mask. The B-UNCD film is etched to form boron doped UNCD nanowires. Optionally, the sacrificial layer below the B-UNCD nanowires is etched to release the B-UNCD nanowires. The B-UNCD nanowires thus formed have a gauge factor of at least about 70. In particular embodiments, the gauge factor or the B-UNCD nanowires is in the range of about 70 to about 1,800.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein.

BRIEF DESCRIPTION OF DRAWINGS

The foregoing and other features of the present disclosure will become more fully apparent from the following description and appended claims, taken in conjunction with the accompanying drawings. Understanding that these drawings depict only several implementations in accordance with the disclosure and are therefore, not to be considered limiting of its scope, the disclosure will be described with additional specificity and detail through use of the accompanying drawings.

FIG. 4 panel B is an enlarged view of a portion of the FIG. 4 panel A showing the fabricated B-UNCD nanowires and FIG. 4 panel C shows the B-UNCD nanowires released after etching a sacrificial layer disposed below the B-UNCD nanowires.

FIG. 6 panel B shows another force sensor that includes a plurality of B-UNCD nanowires. FIG. 6 panel C shows an enlarged view of a B-UNCD nanowire that has a first length and a first width, and FIG. 6 panel D shows further enlarged view of the nanowire of panel C.

FIG. 7 panel D is a transmission line model (TLM) plot of each of the B-UNCD nanowires of FIG. 7 panels A, B and C showing the change in resistance of the nanowires in relationship to the length of the nanowires.

FIG. 11 panel B is a plot of resistance vs. displacement of a B-UNCD nanowire obtained from the plot of panel A.

FIG. 15 panel B is a high resolution TEM image of a single diamond grain showing the structural defect within the crystal. FIG. 15 panel C is an enlarged view of a portion of the image of panel B showing {111} twin grain boundary between the arrows. Inset selected area electron diffraction (SAED) confirms the {111} mirror plane in the defect.

FIG. 16 panel B is an EELS spectra of a single diamond grain included in the B-UNCD film. FIG. 16 panel C shows the energy loss near-edge fine structure (ELNES) of the boron K-edge.

Figure 1:
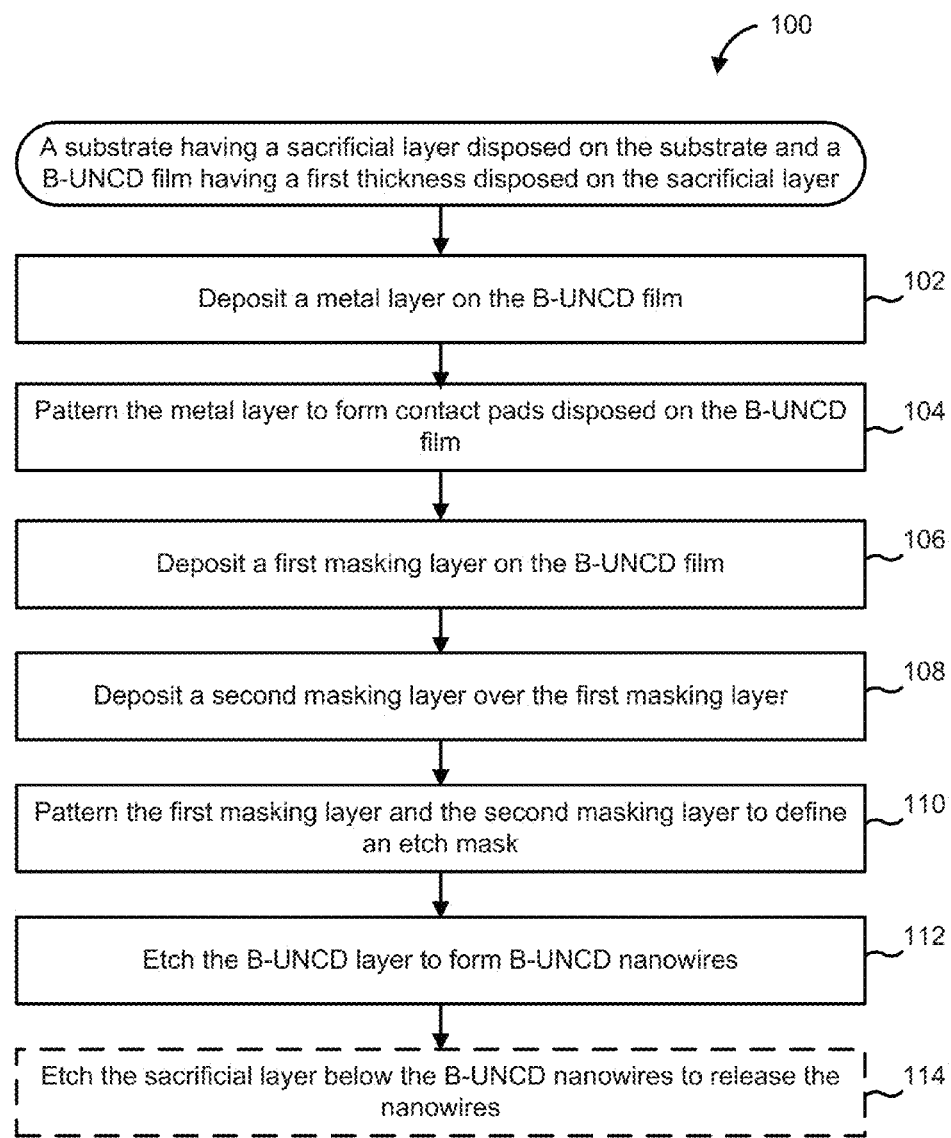
FIG. 1 is a schematic flow diagram of a method for fabricating B-UNCD nanowires on a substrate, according to an embodiment.

Reference is made to the accompanying drawings throughout the following detailed description. In the drawings, similar symbols typically identify similar components, unless context dictates otherwise. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

DETAILED DESCRIPTION OF VARIOUS EMBODIMENTS

Embodiments described herein relate generally relate to methods of fabricating PZR sensors, and in particular to methods of fabricating PZR boron doped ultrananocrystalline diamond (UNCD) nanowires and displacement sensors formed therefrom.

Embodiments of the B-UNCD nanowires and displacement sensors formed therefrom may provide several benefits including, for example: (1) providing highly sensitive displacement sensors or force sensors that can measure displacement in the nm range and/or force in the nano Newton and pico Newton range; (2) tolerating harsh environments as UNCD is chemical inert, resists oxidation and thus can be used in highly corrosive or oxidative environments; (3) having a gauge factor which can be about 10 times the gauge factor of diamond film, thus providing superior resolution and sensitivity; and (4) having extremely small size which can allow the sensors to be used in novel applications, for example, tactile sensing, remote sensing, aerospace pressure sensing, automotive accelerometers and high temperature MEMS or nano-electro-mechanical-systems (NEMS) applications.

As used herein, the term "ultrananocrystalline diamond (UNCD)" refers to crystalline diamond that has a grain size in the range of 2 nm to 10 nm; the term "nanocrystalline diamond (NCD)" refers to crystalline diamond that has a grain size in the range of 10 nm to 200 nm; and the term "microcrystalline diamond (MCD)" refers to crystalline diamond which is greater than 200 nm.

FIG. 1 is a schematic flow diagram of an exemplary method 100 for fabricating B-UNCD nanowires. Such B-UNCD nanowires can be used for fabricating displacement sensors, for example, any of the displacement sensors described herein. The B-UNCD nanowires are fabricated on a substrate that has a sacrificial layer disposed thereon and a B-UNCD film having a first thickness disposed on the sacrificial layer. The substrate can include Si, glass, quartz, pyrex, silicon oxide, silicon nitride, silicon carbide, metals (e.g., chromium (Cr), titanium (Ti), platinum (Pt), gold (Au), copper (Cu), any other suitable metal or a combination thereof), ceramics, polymers, any other suitable substrate or a combination thereof. The substrate can be in the form of wafers, for example, 3 inch, 4 inch, 6 inch, 8 inch, 12 inch or have any other shape or size.

The sacrificial layer is formed from an electrically non-conductive material such as, for example, silicon oxide, silicon nitride, silicon carbide or any other suitable layer which can allow the deposition of a B-UNCD film thereon. The sacrificial layer can have any suitable thickness, for example, in the range of about 0.1 micron to about 2 microns, for example, about 1 microns.

The B-UNCD film can be deposited over the sacrificial layer using any suitable method. In one embodiment, the UNCD film is deposited over the sacrificial layer using hot filament chemical vapor deposition (HFCVD). In other embodiments, the UNCD film can be deposited using a microwave plasma deposition process. The first thickness of the UNCD film can be in the range of about 20 nm to about 200 nm. For example, the first thickness can be about 20 nm, 30 nm, 40 nm, 50 nm, 60 nm, 70 nm, 80 nm, 90 nm, 100 nm, 110 nm, 120 nm, 130 nm, 140 nm, 150 nm, 160 nm, 170 nm, 180 nm, 190 nm, or about 200 nm inclusive of all ranges and values therebetween.

In some embodiments, the boron included in the B-UNCD film can be incorporated into the UNCD film in situ during the UNCD film deposition or otherwise growth on the sacrificial layer. For example, a boron gas (e.g., $B_2H_6$ or trimethyl borate) can be communicated into the growth chamber during the UNCD growth process such that boron ions are incorporated into the UNCD film as the UNCD film grows on the sacrificial layer to form the B-UNCD film. In other embodiments, boron can be implanted ex situ into a UNCD films which is already deposited on the sacrificial layer.

In some embodiments, the concentration of the boron in the B-UNCD film can be in the range of about $1\times10^{21}$ atoms per cm$^3$ to about $9\times10^{21}$ atoms per cm$^3$ (e.g., about $2\times10^{21}$, $3\times10^{21}$, $4\times10^{21}$, $5\times10^{21}$, $6\times10^{21}$, $7\times10^{21}$, or about $8\times10^{21}$ atoms per cm$^3$ inclusive of all ranges and values therebetween). In one embodiment, the boron concentration in the B-UNCD films can be about $4.8\times10^{21}$ atoms per cm$^3$.

A metal layer is deposited on the B-UNCD film, at 102. The metal layer can include any metal (e.g., Cr, Ti, Pt, Au, Cu, any other suitable metal or a combination thereof). In some embodiments, the metal layer can include a plurality of metals disposed on each other. For example, the metal layer can include a Ti/Pt layer. In one embodiment, the Ti layer can have a thickness of about 10 nm and serve as an adhesion layer between the sacrificial layer and the Pt layer. The Pt layer can have a thickness of about 100 nm and will serve to form contact pads for the B-UNCD nanowires as described herein.

The metal layer is patterned to form the contact pads disposed on the B-UNCD films, at 104. The metal layer can be patterned using standard lithography techniques, for example, photolithography, chemical etching, etc. The contact pads can have any suitable shape, for example, square, rectangular, circular, oval, or any other suitable shape. Furthermore, the contact pads can have any suitable size, for example, have a cross-section of about 0.5 mm to about 5 mm, inclusive of all ranges and values therebetween. The contact pads serve to provide electrical interface of the B-UNCD nanowires with the electronic instrumentation. For example, the contact pads can be electrically contacted via probes, bonded (e.g., wire bonded) or soldered to electronic instrumentation. The electronic instrumentation can be configured to communicate an electrical signal (e.g., voltage or current) across the B-UNCD nanowire and measure an electrical parameter of the B-UNCD nanowire (e.g., resistance or otherwise change in resistance), for example, in response to a displacement of the B-UNCD nanowire, as described herein.

A first masking layer is deposited on the B-UNCD film, at 106. The first masking layer can include a metal layer such as, for example, a 10 nm/100 nm Ti/Pt layer. A second masking layer is disposed over the first masking layer, at 108. In some embodiments, the second masking layer can include a photoresist. In some embodiments, the second masking layer can include an e-beam photoresist such as hydrogen silsesquioxane (HSQ) or any other suitable e-beam photoresists. In other embodiments, the first masking layer is not disposed and only the second masking layer is disposed on the B-UNCD film. In other words, the second masking layer can serve as the sole masking layer for the B-UNCD film.

The first masking layer and the second masking layer are patterned to define an etch mask, at 110. In particular embodiments, the second masking layer can be patterned using e-beam lithography (EBL) and then developed in an appropriate developer, for example, a tetramethylammonium hydroxide based developer (e.g., MF® CD-26). In other embodiments, the second masking layer can be patterned using laser etching. The patterning of the second masking layer defines a pattern or template for the B-UNCD nanowires. The first masking layer which is underneath the second masking layer is then patterned, for example, using physical etching (e.g., radio frequency plasma etching) or chemical etching (e.g., etched with an appropriate Pt etchant and Ti etchant). In this manner, the B-UNCD nanowire pattern or template is transferred from the second masking layer to the first masking layer.

The B-UNCD film is etched to form the B-UNCD nanowires, at 112. Expanding further, the B-UNCD film is etched with the first masking layer and the second masking layer serving together as an etch mask for the B-UNCD film. The B-UNCD film can be etched using any suitable process such as, for example, oxygen plasma etching, using reactive ion etch process, inductively coupled plasma reactive ion etching (ICP-RIE) or any other suitable etching process. This transfers the B-UNCD nanowire pattern of the first masking layer and the second masking layer into the B-UNCD film. In this manner, one or more B-UNCD nanowires are formed which are disposed on the sacrificial layer.

In some embodiments, the sacrificial layer below the B-UNCD nanowires can optionally be etched to release the B-UNCD nanowires, at 114. The sacrificial layer (e.g., silicon oxide) can be etched using any process, for example, wet chemical etching (e.g., using hydrofluoric acid or buffered hydrofluoride (BHF) or any other suitable etchant). In some embodiments, the first masking layer and the second masking layer can be removed from over the B-UNCD nanowires, for example, using solvents, etchants, or any other chemical removers before etching the sacrificial layer. In such embodiments, the process or otherwise chemical used to etch the sacrificial layer can be inert with respect to the B-UNCD nanowires. In other embodiments, the first sacrificial layer and the second sacrificial layer can be removed after the sacrificial layer has been etched, for example, to protect the B-UNCD nanowires from a reactive etchant.

In this manner, B-UNCD nanowires that have a first end electrically coupled to a first contact pad, and second end electrically coupled to a second contact pad are fabricated. The B-UNCD nanowires can be disposed over the sacrificial layer or suspended over the substrate via the first end and the second end (e.g., in embodiments where the sacrificial layer is etched to release the B-UNCD nanowires). The method can be used to form a single B-UNCD nanowire or a plurality of B-UNCD nanowires with each nanowire disposed or suspended over the substrate between the first contact pad and the second contact pad by the first end and the second end.

The B-UNCD nanowires fabricated using the method 100 have piezoresistive properties. For example, the B-UNCD nanowires can be movable between a first configuration and a second configuration. In the first configuration, no force is exerted on the B-UNCD nanowire and the B-UNCD nanowire has a first electrical parameter (e.g., a first resistance). In the second configuration, the B-UNCD nanowire bends in response to a force and the B-UNCD nanowire has a second electrical parameter (e.g., second resistance) which is different from the first electrical parameter. Moreover, the B-UNCD nanowire can be structured to have a gauge factor of at least about 70 (e.g., in the range of about 70 to about 1,800). The gauge factor of the B-UNCD nanowire can be about 10 times greater than a gauge factor of the B-UNCD film (e.g., a gauge factor of 7).

In some embodiments, the B-UNCD nanowire formed using the method 100 or any other method described herein can have a width in the range of about 20 nm to about 200 nm (e.g., about 20 nm, 30 nm, 40 nm, 50 nm, 60 nm, 70 nm, 80 nm, 90 nm, 100 nm, 110 nm, 120 nm, 130 nm, 140 nm, 150 nm, 160 nm, 170 nm, 180 nm, 190 nm, or about 200 nm inclusive of all ranges and values therebetween). Furthermore, the B-UNCD nanowires can have any suitable length, for example, in the range of about 0.5 micron to about 25 micron (e.g., about 0.5 microns, 1 microns, 2 microns, 3 microns, 4 microns, 5 microns, about 10 microns, about 15 microns, about 20 microns or about 25 microns, inclusive of all ranges and values therebetween).

In some embodiments, the B-UNCD nanowires can have a gauge factor of about 70 to about 1,800 (e.g., 70, 100, 200, 300, 400, 500, 600, 700, 800, 900, 1,000, 1,100, 1,200, 1,300, 1,400, 1,500, 1,600, 1,700, or about 1,800 inclusive of all ranges and values therebetween). The gauge factor of the B-UNCD nanowires can be at least about 10 times higher than the gauge factor of a UNCD film (e.g., gauge factor of 7). In particular embodiments, the first resistance of the B-UNCD nanowire can be in the range of about 25 k Ohms to about 1,000 k Ohms, and the second resistance is greater than the first resistance.

Figure 2:
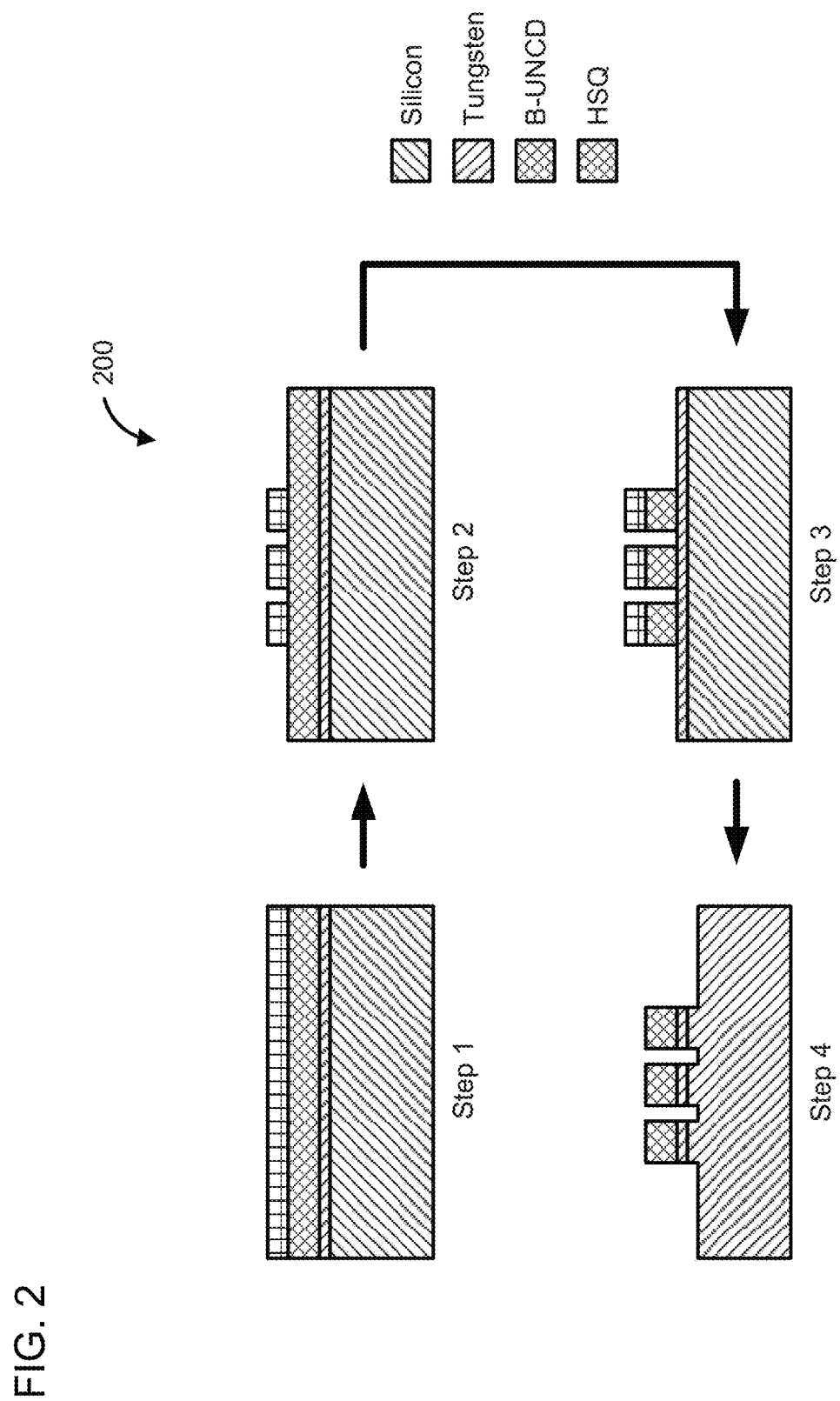
FIG. 2 is a schematic diagram of a method for fabricating B-UNCD nanowires on a substrate, according to another embodiment.

FIG. 2 shows a schematic diagram of a method 200 for fabricating B-UNCD nanowires, according to another embodiment. The method 200 includes a Si substrate that has thin layer (e.g., less than about 200 nm) of tungsten disposed on the substrate and a B-UNCD layer is deposited over the tungsten layer. A HSQ masking layer is disposed over the B-UNCD layer, at Step 1. The HSQ layer serves as a masking layer which can be patterned into a template of the B-UNCD nanowires, as described herein.

The HSQ layer is patterned to form a nanowire template, at Step 2. For example, the HSQ layer can be patterned using EBL and then developed using an appropriate developer to form the nanowire template. Using the patterned HSQ layer as an etch mask, the exposed B-UNCD layer or otherwise a portion of the B-UNCD layer that is not covered by the HSQ template is etched, at Step 3. Etching can be performed using any suitable process as described with respect to the method 100. This transfers the nanowire pattern into the B-UNCD layer such that B-UNCD nanowires are formed which are disposed on the Ti layer disposed over the Si substrate.

The exposed tungsten layer is then etched such that the tungsten layer below the nanowires is removed leaving B-UNCD nanowires suspended on the substrate, at Step 4. Thus the tungsten layer can serve as a sacrificial layer which is etched to release the B-UNCD nanowires. In other embodiments, the tungsten layer can also provide a seeding or otherwise nucleation layer for growth of the B-UNCD nanowires. In still other embodiments, any other sacrificial layer can be used in place of the tungsten layer such as silicon oxide, silicon nitride, etc.

While not shown in FIG. 2, contact pads can be disposed on the substrate. The B-UNCD nanowires formed using the method 200 can include a first end electrically coupled to a first contact pad and a second end electrically coupled to a second contact pad. In this manner, the B-UNCD nanowire can be suspended over the Si substrate via the first end and the second end. Furthermore, the B-UNCD nanowires formed using the method 200 can have piezoresistive properties. The B-UNCD nanowires formed using the method 200 can be substantially similar to the B-UNCD nanowires formed using the method 100 and therefore, not described in further detail herein.

Figure 3:
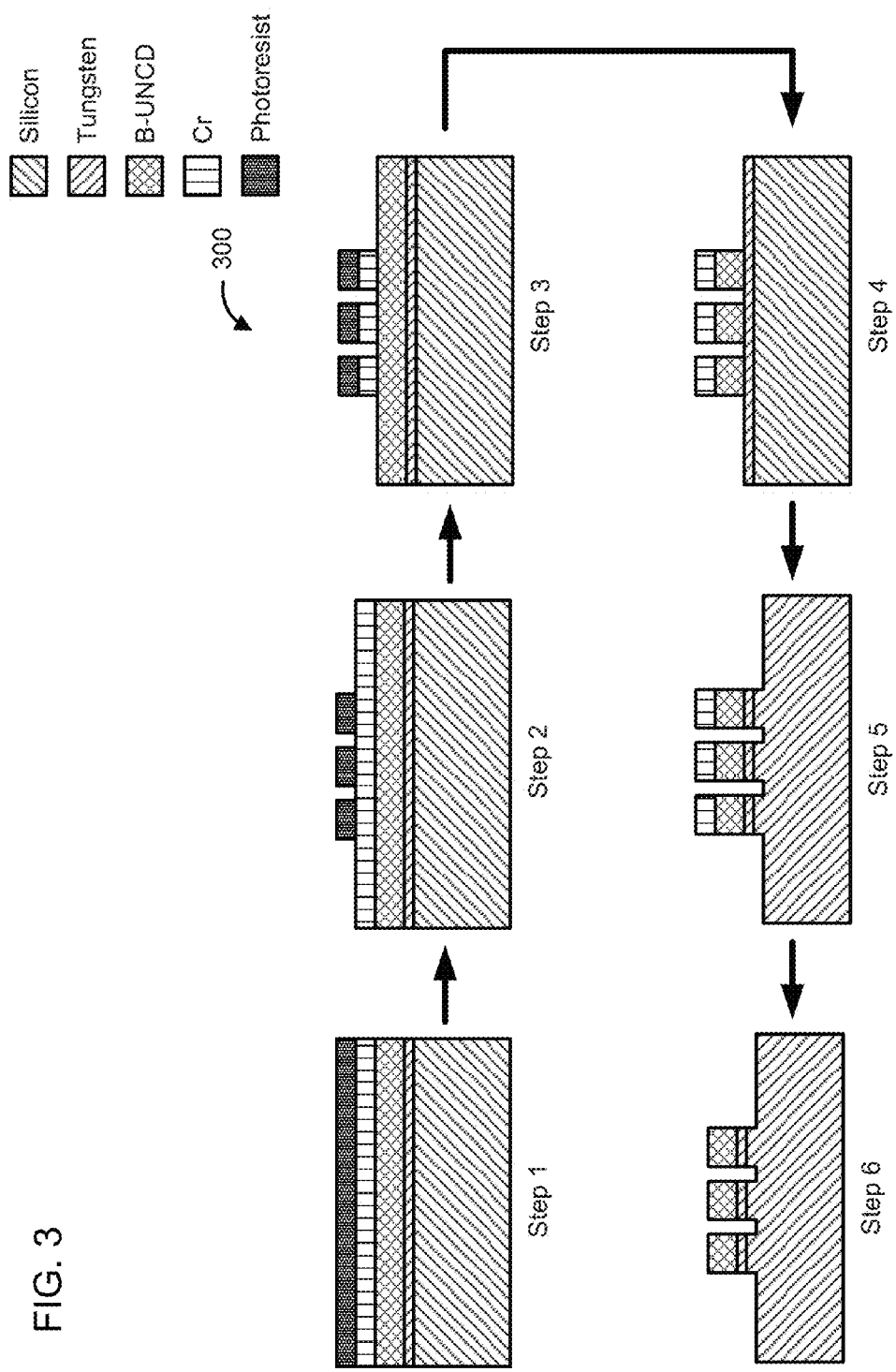
FIG. 3 is a schematic diagram of a method for fabricating B-UNCD nanowires on a substrate, according to yet another embodiment.

FIG. 3 shows a schematic diagram of a method 300 for fabricating B-UNCD nanowires, according to yet another embodiment. The method 300 includes a Si substrate that has thin layer (e.g., less about 200 nm) of tungsten disposed on the substrate. A B-UNCD layer is deposited over the tungsten layer. A Pt/Ti layer is disposed over the B-UNCD layer and a negative photoresist is disposed over the Pt/Ti layer, at Step 1. In one embodiment, the negative photoresist can include MA-N 1405® which is available from Microchem, Inc.

The negative photoresist (e.g., MA-N 1405®) is patterned using laser lithography or electron beam lithography and developed to define a pattern or otherwise template of the nanowires in the negative photoresist layer, at Step 2. With the patterned photoresist acting as an etch mask, the Pt/Ti layer disposed beneath the negative photoresist is etched (e.g., wet etched with Pt/Ti etchant), at Step 3 to transfer the nanowire pattern into the Pt/Ti layer.

The negative photoresist is removed and with the patterned Pt/Ti layer serving as an etch mask, the B-UNCD layer disposed below the Pt/Ti layer is etched, at Step 4 to form B-UNCD nanowires disposed over the tungsten layer. The tungsten layer is etched, at Step 5. The Pt/Ti disposed over the B-UNCD nanowire is then removed (e.g., via wet etching) and the tungsten layer disposed below the B-UNCD nanowires is etched to release the B-UNCD nanowires, at Step 6.

In some embodiments, the B-UNCD nanowires can be fabricated using any other "top-down" fabrication process. For example, B-UNCD microwires can be prepared using any suitable fabrication process and then controlled etching can be performed to reduce the dimensions of the B-UNCD nanowire to the nanoscale (e.g., having a width of about 20 nm to about 200 nm). In other embodiments, the B-UNCD nanowires can be fabricated using nano imprint lithography. In still other embodiments, the B-UNCD nanowires can be formed using a "bottom-up" fabrication process, for example, self-assembly techniques.

Figure 4:
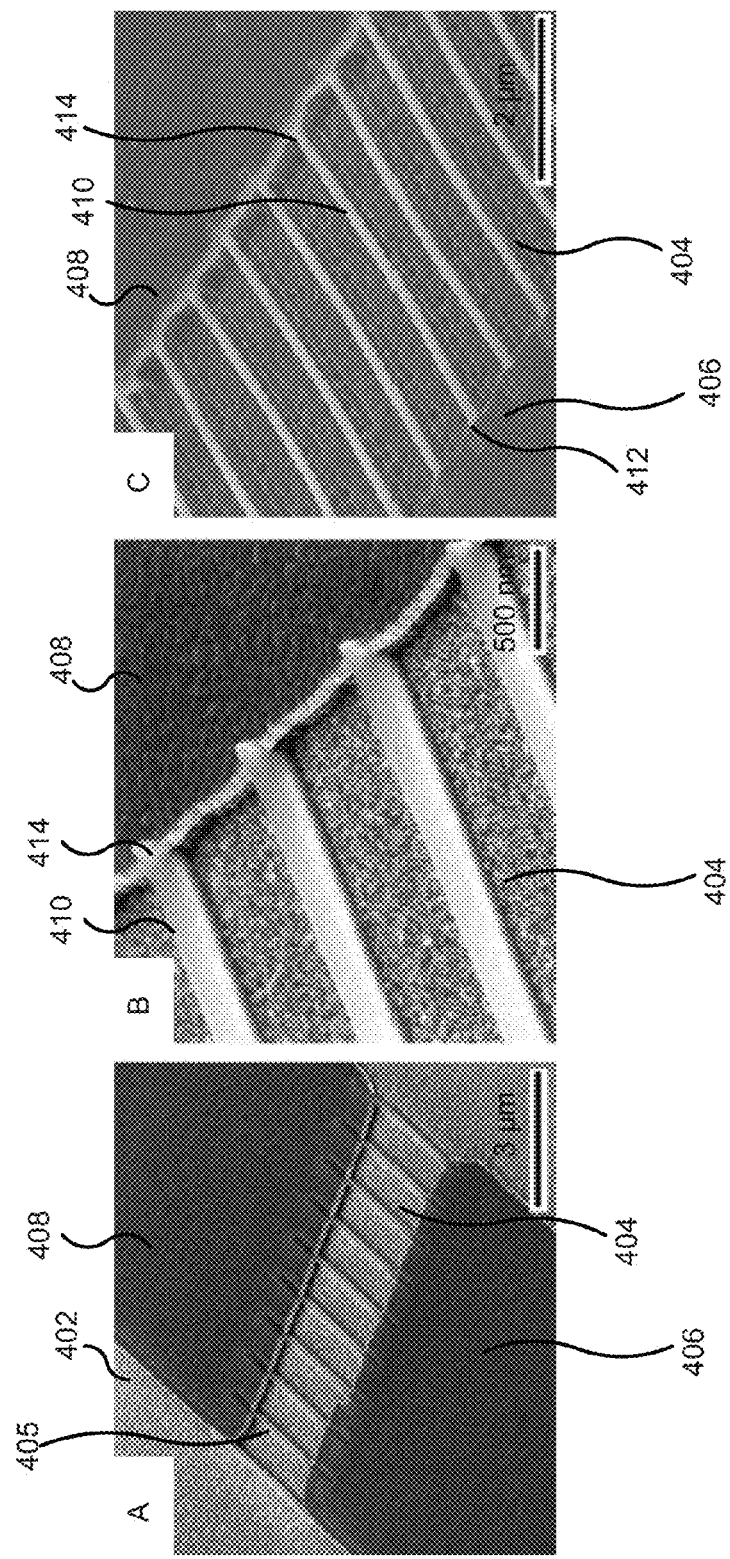
FIG. 4 panel A is a scanning electron microscope (SEM) image of a plurality of B-UNCD nanowires fabricated on a substrate with an etch mask disposed thereon.

FIG. 4 panels A-C are images of UNCD nanowires 410 fabricated on a substrate 402 at various stages of fabrication. The fabrication process used to form the UNCD nanowires 410 was substantially similar to the method 100. However, any other process can be used to form the UNCD nanowires 410, for example, the method 200, 300 or any other method described herein.

The substrate 402 is formed from Si. A sacrificial layer 404 is disposed over the substrate 401. The sacrificial layer 404 is formed from silicon oxide but any other material can be used, for example, silicon nitride. A UNCD film is disposed on the sacrificial layer 404. The UNCD layer is doped with boron as a dopant to form a B-UNCD film. The boron or otherwise dopant can be incorporated into the UNCD film during the UNCD film growth process or implanted afterwards, as described with respect to the method 100. The B-UNCD film can have a concentration of boron in the range of about $1 \times 10^{21}$ atoms per cm$^3$ to about $9 \times 10^{21}$ atoms per cm$^3$ (e.g., about $4.8 \times 10^{21}$ atoms per cm$^3$).

A first contact pad 406 and a second contact pad 408 are patterned on the B-UNCD layer. The first contact pad 406 and the second contact pad 408 include a Ti layer which serves as an adhesion layer. A Pt layer is disposed over the Ti layer. The Ti and Pt layer can have any suitable thickness. In one embodiment, the Ti layer is 10 nm thick and the Pt layer is 100 nm thick. The first contact pad 406 and the second contact pad 408 can be formed using any suitable process, for example, lithography, wet or dry etching, etc.

An HSQ layer is deposited over the B-UNCD film and patterned using EBL to form a pattern or otherwise template of HSQ nanowires 405 on the B-UNCD film across the first contact pad 406 and the second contact pad 408, as shown in FIG. 4 panel A. Using the HSQ nanowire 405 pattern as an etch mask, the B-UNCD film is etched to transfer the pattern of the nanowires into the B-UNCD film to form B-UNCD nanowires 410 disposed over the sacrificial layer 404. The HSQ layer 405 is then removed. FIG. 4 panel B shows an SEM image of the B-UNCD nanowires 410 disposed on the sacrificial layer 404.

Each B-UNCD nanowire 410 comprises a first end 412 electrically coupled to the first contact pad 406 which is disposed on the substrate 402 (i.e., on the sacrificial layer 404 disposed on the substrate 402 ). The B-UNCD nanowires 410 also have a second end 414 which is electrically coupled to the second contact pad 408 also disposed on the substrate. The sacrificial layer 404 underneath the B-UNCD nanowires is etched to release the B-UNCD nanowires 410 such that the B-UNCD nanowires 410 are suspended over the substrate 402 via the first end 412 and the second end 414.

The B-UNCD nanowires 410 are moveable between a first configuration and a second configuration and have piezoresistive properties. In the first configuration, no force is exerted on the B-UNCD nanowires 410 and the B-UNCD nanowires 410 have a first resistance. In the second configuration the B-UNCD nanowire s 410 bends about the first end 412 and the second end 414 in response to a force such that the B-UNCD nanowires 410 have a second resistance different than the first resistance in the second configuration. For example, the second resistance can be higher than the first resistance such that the difference in resistance corresponds to the displacement of the B-UNCD nanowires 410 or otherwise the force exerted on the B-UNCD nanowires 410. In some embodiments, the first resistance can be in the range of about 25 kOhms to about 1,000 kOhms. In further embodiments, such B-UNCD nanowires can experience a change in resistance of about 150 Ohms per nm displacement of the B-UNCD nanowires 410.

In this manner, the B-UNCD nanowires 410 can serve as displacement sensor or otherwise force sensor. Furthermore, the B-UNCD nanowires 410 are structured to have a gauge factor which is about 10 times greater than a gauge factor of the UNCD film. For example, the UNCD film can have a gauge factor of about 7 and a gauge factor of the B-UNCD nanowires 410 can be at least about 70 (e.g., 70, 100, 200, 300, 400, 500, 600, 700, 800, 900, 1,000, 1,100, 1,200, 1,300, 1,400, 1,500, 1,600, 1,700, or about 1,800 inclusive of all ranges and values therebetween).

In some embodiments, the B-UNCD nanowires 410 can have a width in the range of about 20 nm to about 200 nm (e.g., about 20 nm, 30 nm, 40 nm, 50 nm, 60 nm, 70 nm, 80 nm, 90 nm, 100 nm, 110 nm, 120 nm, 130 nm, 140 nm, 150 nm, 160 nm, 170 nm, 180 nm, 190 nm, or about 200 nm inclusive of all ranges and values therebetween). Moreover, the B-UNCD nanowires 410 can have any suitable length, for example, in the range of about 0.5 micron to about 25 micron (e.g., about 0.5 microns, 1 microns, 2 microns, 3 microns, 4 microns, 5 microns, about 10 microns, about 15 microns, about 20 microns or about 25 microns, inclusive of all ranges and values therebetween).

Figure 5:
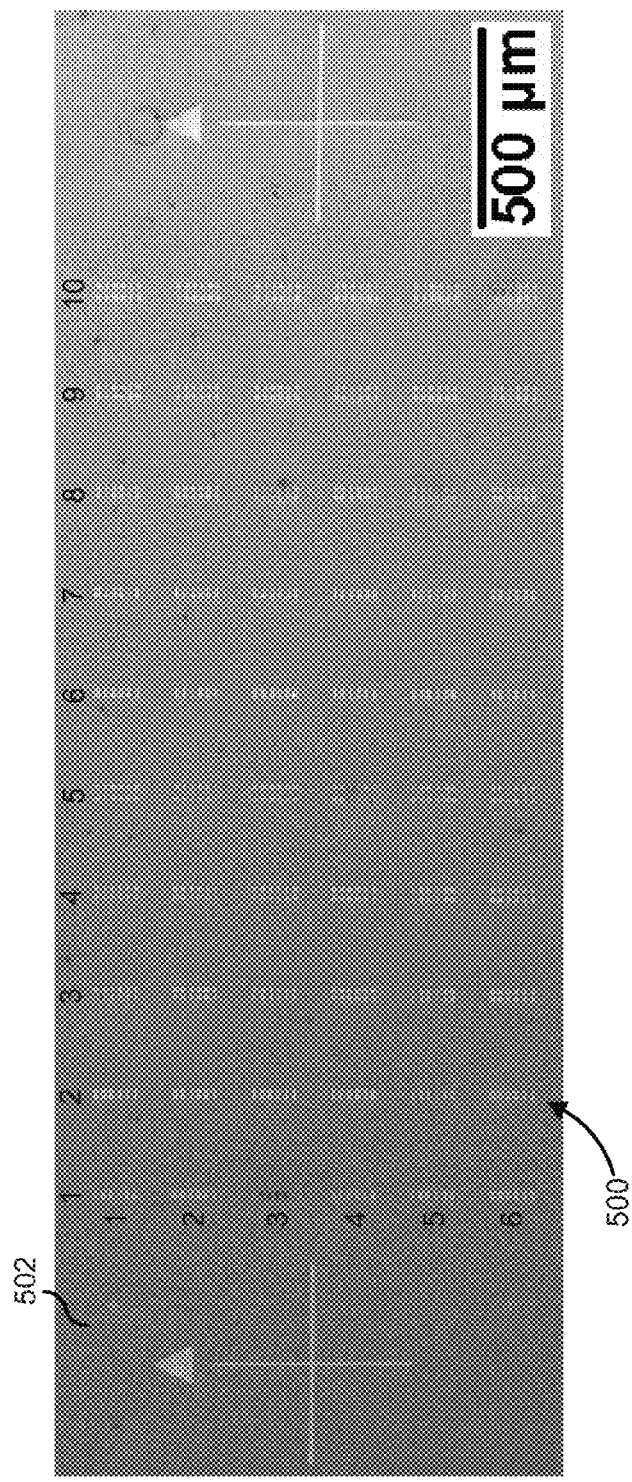
FIG. 5 is an SEM image of substrate that includes a plurality of force sensing devices disposed thereon, each force sensing device including B-UNCD nanowires.
Figure 6:
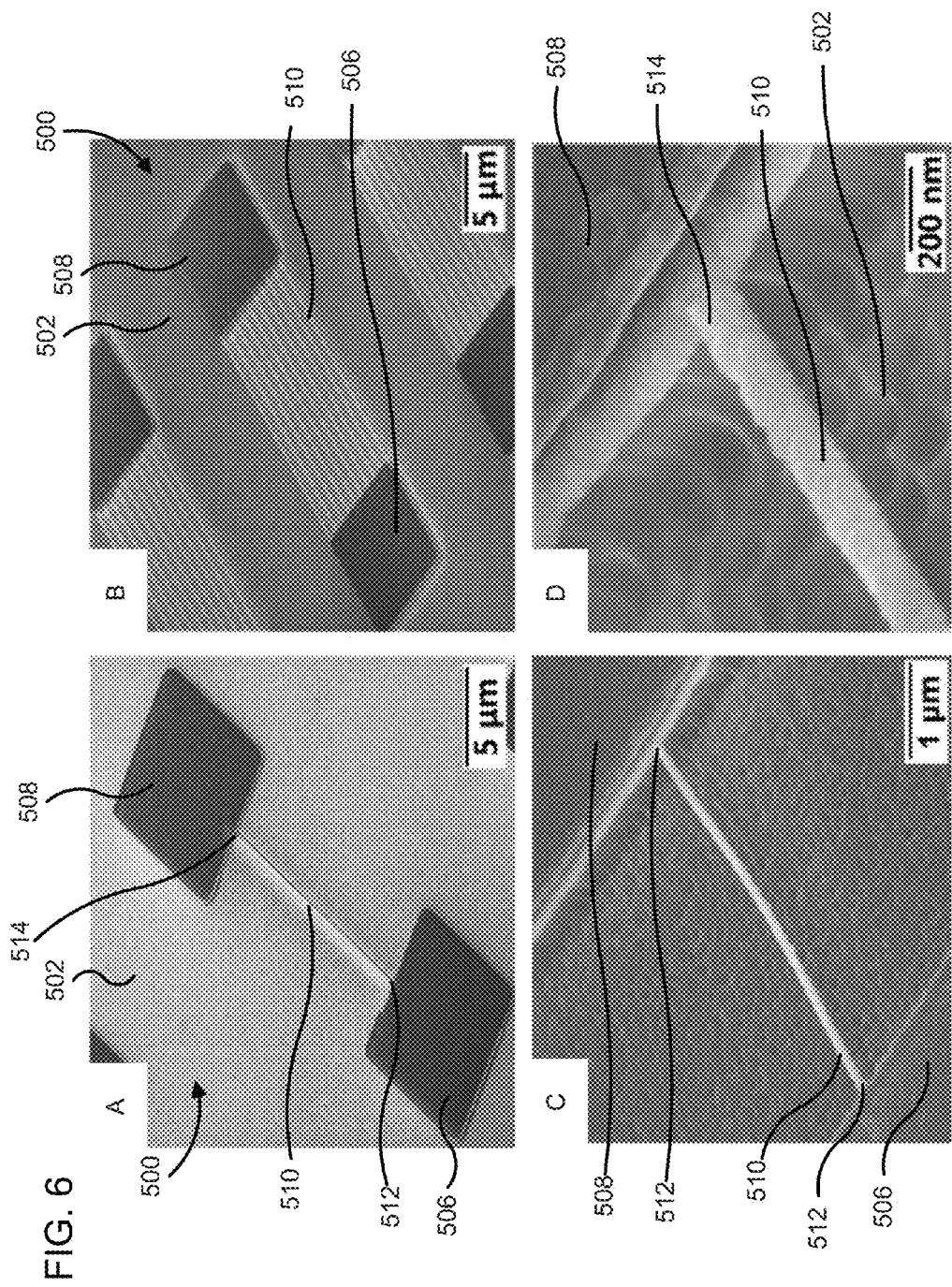
FIG. 6 panel A is an enlarged view of a portion of the substrate of FIG. 5 showing a force sensing device that includes a single B-UNCD nanowire.

FIGS. 5 and 6 show SEM images of a plurality of displacement sensor 500 disposed on a substrate 502. The substrate 502 can be formed from Si and includes a sacrificial layer (e.g., a silicon oxide layer) disposed on the substrate 502.

The displacement sensors 500 includes at least one boron doped diamond nanowire 510 which has a first end 512 and a second end 514. The diamond can include ultrananocrystalline diamond such that each nanowire 510 is a B-UNCD nanowire 510. The displacement sensors 500 include a first contact pad 506 disposed on the substrate 502 which is electrically coupled to the first end 512. A second contact pad 508 is also disposed on the substrate 502 which is electrically coupled to the second end 514. As shown in FIG. 6 panels C and D, the B-UNCD nanowires 510 are suspended over the substrate 502. In other embodiments, the B-UNCD nanowires 510 can be disposed over the substrate 502, i.e. in contact with the sacrificial layer disposed over the substrate 502.

The B-UNCD nanowires 510 are movable between a first configuration and a second configuration. In the first configuration, no force is exerted on the B-UNCD nanowires 510 and the B-UNCD nanowires 510 have a first electrical parameter. In the second configuration, the B-UNCD nanowires 510 bend about the first end 512 and the second end 514 in response to a force such that the B-UNCD nanowires 510 have a second electrical parameter different than the first electrical parameter in the second configuration.

The B-UNCD nanowires 510 are structured to have a gauge factor of at least about 70, for example, 10 times the gauge factor of a B-UNCD film. In some embodiments, the B-UNCD nanowires 510 can have a gauge factor in the range of about 70 to about 1,800.

In some embodiments, the first electrical parameter and the second electrical parameter can include resistances. The second resistance can be greater than the first resistance such that a difference between the first resistance and the second resistance corresponds to a displacement of the B-UNCD nanowires 510 or otherwise the force exerted on the B-UNCD nanowires 510. In some embodiments, the first resistance can be in the range of about 25 kOhms to about 1,000 kOhms. In particular embodiments, the displacement sensors 500 can have a resolution of about 150 Ohms per nm displacement of the B-UNCD nanowires 510.

Referring to FIG. 5, the crosses shown on either side of the displacement sensors 500 are alignment marks to locate the first contact pad 506 and the second contact pad 508. The displacement sensors 500 are disposed in a 10×6 array with 6 rows (labeled 1 -6) and 10 columns (labeled 1-10). In row 1 and 2, a width B-UNCD nanowires 510 is about 75 nm (FIG. 6 panel A). In rows 3 and 4, the width of the B-UNCD nanowires 510 is about 125 nm, and in rows 5 and 6, the width of the B-UNCD nanowires is about 175 nm. In some embodiments, the B-UNCD nanowires 510 included in the displacement sensors 500 can have any suitable width (e.g., in the range of about 20 nm to about 200 nm).

Columns 1-5 include displacement sensors 500 that include a single B-UNCD nanowire 510 disposed between the first contact pad 506 and the second contact ad 508 (FIG. 6 panels A, C and D). Columns 6-10 include displacement sensors 500 that include 10 B-UNCD nanowires disposed between the first contact pad 506 and the second contact ad 508 (FIG. 6 panel B). The lengths of the B-UNCD nanowires 510 from column 1-5 are about 2 microns, 5 microns, 10 microns, 15 microns, and about 20 microns respectively. Similarly, the lengths of the B-UNCD nanowires 510 from column 6-10 are about 2 microns, 5 microns, 10 microns, 15 microns, and about 20 microns respectively. In other embodiments, the B-UNCD nanowires 510 can have any suitable length, for example, in the range of about 0.5 microns to about 25 microns.

Electrical and piezoresistive measurements were performed on the various displacement sensors 500 disposed on the substrate 502. Since the B-UNCD nanowires 510 are released from the substrate 502 and suspended over the substrate 502 via the first end 512 and the second end 514, any electrical current communicated through the B-UNCD nanowires 510 only flows through the nanowires 510. Furthermore, no residue exists on the B-UNCD nanowires 510 as can be seen in FIG. 6 panel D. This also assures that the B-UNCD nanowires have good thermal conductivity to dissipate heat generated by any electrothermal effects.

Figure 7:
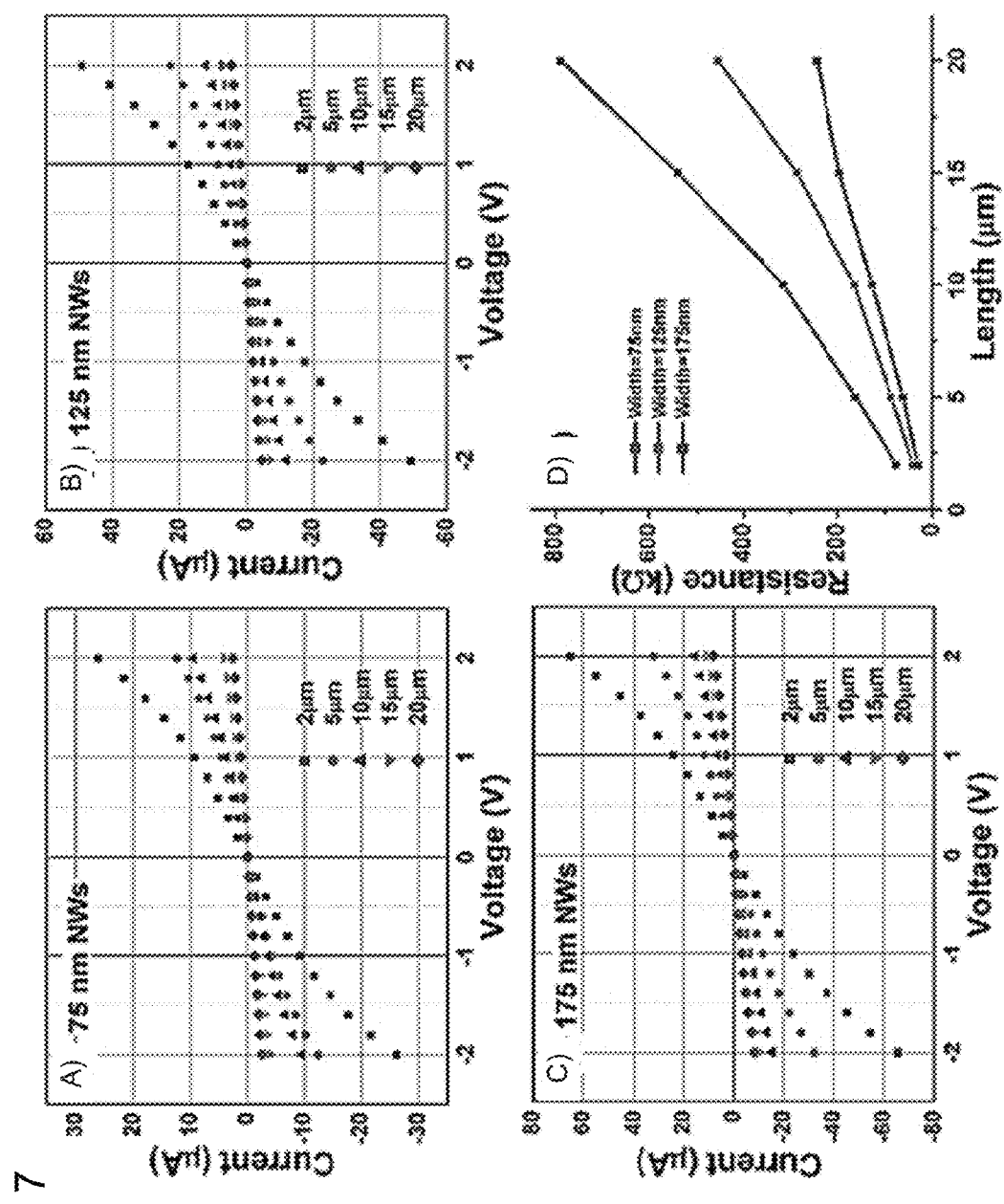
FIG. 7 panels A, B, and C are current vs. voltage (I-V) plots of B-UNCD nanowires which have lengths of about 75 nm, 125 nm, and about 175 nm respectively.

FIG. 7 panels A-C shows I-V plots of the B-UNCD nanowires 510 included in the displacement sensors 500 that have a width of the B-UNCD nanowires 510 of about 75 nm, 125 nm and 175 nm, respectively. Furthermore, each plot includes I-V plots of B-UNCD nanowires 510 that have lengths of about 2 microns, 5 microns, 10 microns, 15 microns, and about 20 microns. As seen in FIG. 7, the I-V curves of each of the B-UNCD nanowires 510 are symmetric and mostly linear which indicates that the B-UNCD nanowires 510 are Ohmic. The current at +/−2 volts is in the order of $10^{-5}$ Amps which indicates high current density with the B-UNCD nanowires 510 cross-section.

FIG. 7 panel D shows a TLM plot of the B-UNCD nanowires 510 which shows the increase in resistance of the B-UNCD nanowires 510 as a function of length. The resistance of the B-UNCD nanowires 510 increases quasi-linearly with the nanowires 510 length, and decreases with the nanowires 510 width. Overall, the resistance of the B-UNCD nanowires 510 was in the range of about 25 kOhms to about 1,000 kOhms which is about 6 orders of magnitude lower as compared to the GOhms resistance of comparable nitrogen doped UNCD (N-UNCD) nanowires. This is because the N-UNCD atoms preferentially incorporate into the grain boundaries which limits the doping level and the electron transport of the UNCD film.

In contrast, in case of the B-UNCD nanowires, the boron atoms substitute the carbon atoms in the grains which results in a higher doping capability. This effect cannot be explained as a result of Schottky contacts, due to the symmetric I-V profile. One possible interpretation of this effect is called space-charge-limit (SCL) current. In the nanowire form, the high aspect ratio is expected to strongly influence SCL current, due to the higher carrier depletion and poorer electrostatic screening comparing to bulk B-UNCD film. Furthermore, electrothermal effects can also contribute to the non-linearity observed in the I-V and TLM plots.

Figure 8:
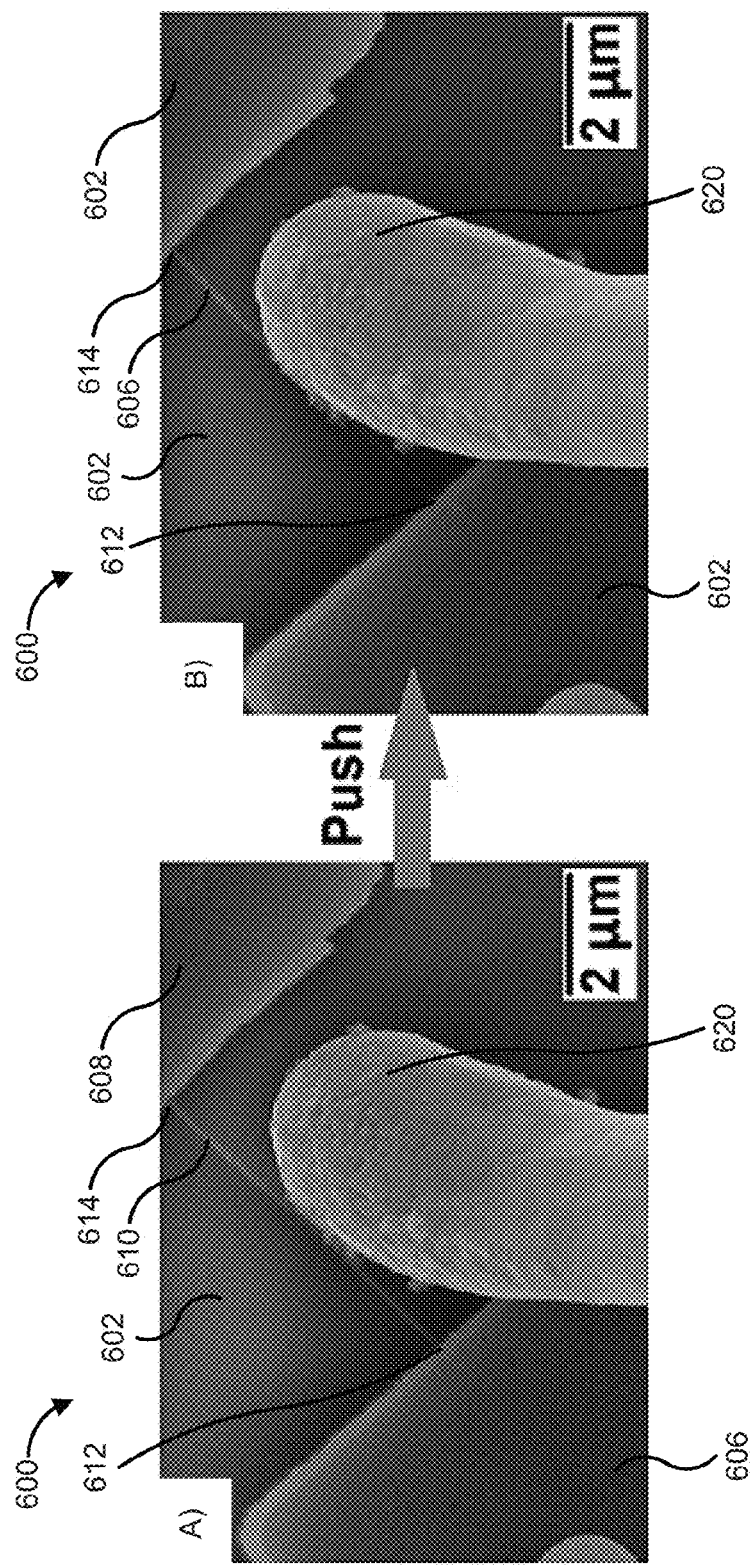
FIG. 8 panel A shows a force sensor that includes a single B-UNCD nanowire suspended between contact pads and a probe in proximity of the nanowire, and FIG. 8 panel B shows the nanowire being deflected by the probe.

FIG. 8 panels A and B show a displacement sensor 600 that includes a B-UNCD nanowire 610. The B-UNCD nanowire has first end 612 electrically coupled to a first contact pad 606, and a second end 614 electrically coupled to a second contact pad 608. The B-UNCD nanowire 610 is suspended over a substrate 602. The B-UNCD nanowire 610 was subjected to a displacement force using a computer controlled probe 620 and PZR measurements were performed. By applying a transverse pushing force on the B-UNCD nanowire 610 via the probe 620 as shown in FIG. 8 panel B a deflection is generated urging the B-UNCD nanowire 610 to bend about the first end 612 and the second end 614.

Since the B-UNCD nanowire 610 is fixed at the first end 612 and the second end 620, the deflection cause by the transverse force results in elongation of the B-UNCD nanowire 610. This generates a longitudinal tensile stress on the B-UNCD nanowire 610. FIG. 8 panel A shows the unstrained B-UNCD nanowire 610 and FIG. 8 panel B shows B-UNCD nanowire 610 after being strained.

Using this setup, I-V plots were obtained for B-UNCD nanowires having lengths of about 5 microns, about 10 microns, and about 20 microns. Under tensile stress, all lengths of the B-UNCD nanowires demonstrated a change in resistance. As compared to the I-V curves without the strain, the electrical current passing through the strained B-UNCD nanowires decreased, indicating the increase of the resistance. This result is completely different from the PZR effect of similar Si nanowires, where the resistance reduces under tensile stress.

This effect can be explained in terms of the crystalline structure of B-UNCD nanowires. In a polycrystalline structure such as the B-UNCD nanowires, the nanosized grains slides along the grain boundaries creating defects. Especially in the nanowire form, the space is small and restricted and those defects will cause strong reduction of the charge mobility through the B-UNCD nanowire and therefore increase the resistance. Furthermore, the B-UNCD nanowires have a much higher defect density due to the higher boron concentration in the range of about $1 \times 10^{21}$ atoms per $cm^3$ to about $9 \times 10^{21}$ atoms per $cm^3$ (e.g., about $4.8 \times 10^{21}$ atoms per $cm^3$). Because of this, the diamond lattice is already under strain to begin with. Due to the mechanical movement, there is concentration of high local stress within the nanowire increasing this effect and thereby producing the large PZR effect.

The PZR gauge factor, which describes the changing sensitivity of a material given a certain strain, was calculated for the B-UNCD nanowires having a length of about 5 microns, 10 microns, and about 20 microns using the following formula:

$$K = \frac{dR}{R_0 d\epsilon} = 1 + 2v_f + \frac{d\rho}{\rho_0 d\epsilon} \quad (1)$$

where $\rho$ is the resistivity and $\upsilon$ is the Poisson ratio which is around 0.1 for diamond. The strain $\epsilon$ can be calculated as:

$$\epsilon = \frac{dL}{L} = \frac{2 \times \sqrt[2]{(L/2)^2 + D^2} - L}{L} \quad (2)$$

where L is the B-UNCD nanowire length and D is the transverse displacement that is generated by the displacement of the B-UNCD nanowire due to the transverse force provided by a probe (e.g., the probe 620 ). From equations 1 and 2, the gauge factor for the 5 microns, 10 microns and 20 microns are 70, 84 and 96, respectively. These results are comparable with the best available Si nanowire results so far, and are 10 folds higher than nanocrystalline diamond and UNCD films. The results also demonstrated that the gauge factor is higher for longer nanowires. This suggests longer B-UNCD nanowires can have better PZR performance. The gauge factors of 75 nm wide nanowires having various widths are summarized in Table I.

TABLE I

Gauge Factor of Various Lengths of 75 nm wide B-UNCD nanowires

| B-UNCD nanowire length: L (Microns) | Perpendicular Displacement: D (nm) | Percentage of Resistance Change (%) | Gauge Factor |
|---|---|---|---|
| 5 microns | 100 nm | 5.6% | 70 |
| 10 microns | 200 nm | 6.7% | 84 |
| 20 microns | 400 nm | 7.68% | 96 |

Figure 9:
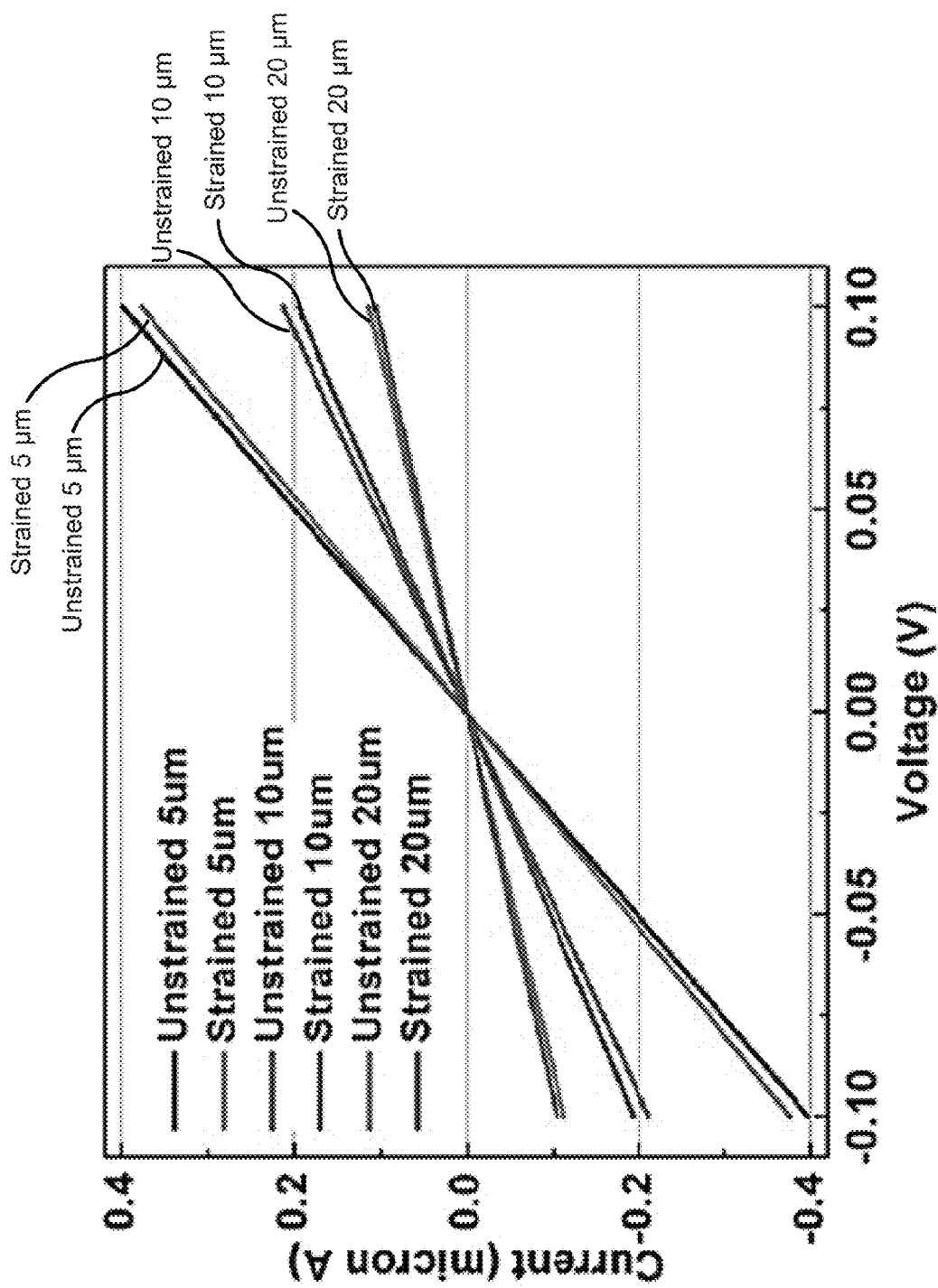
FIG. 9 is an I-V plot of a force sensor that includes 75 nm wide boron doped B-UNCD nanowires having various lengths after being subjected to a strain.
Figure 10:
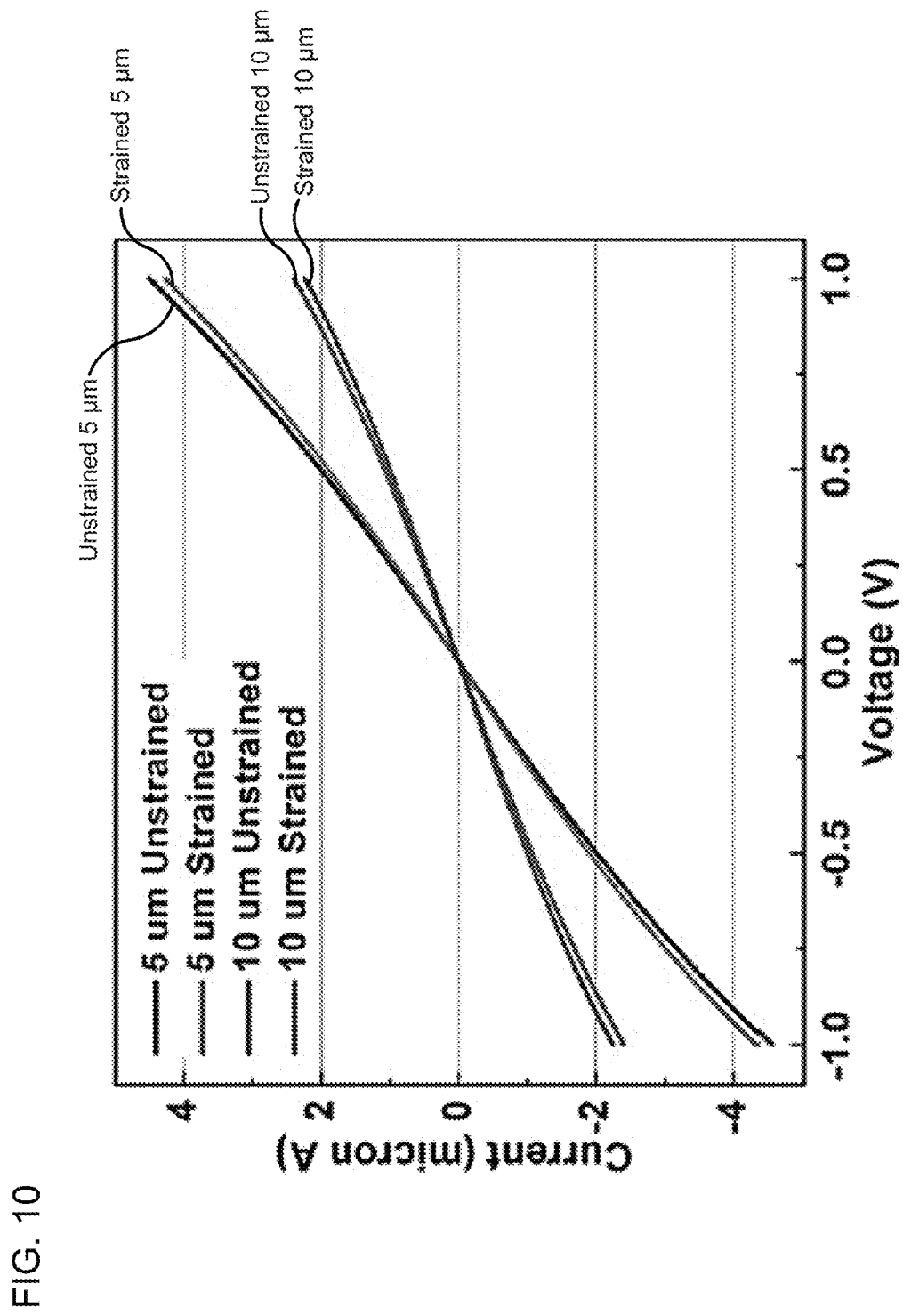
FIG. 10 is an I-V plot of a force sensor that includes 75 nm wide B-UNCD nanowire having lengths of 5 microns and 10 microns.

The non-linear effect of the B-UNCD nanowires was also monitored under the strain. FIG. 10 shows within ±1 V range, the I-V curves of 75 nm wide, and 5 microns and 10 microns long B-UNCD nanowires with and without strain. The slightly non-linear but symmetric I-V plots can be observed from both strained and unstrained cases. The nonlinearity is more pronounced for the 5 micron long B-UNCD nanowires than the 10 micron long B-UNCD nanowires, which agrees with conclusions from the I-V measurements shown in FIG. 9. Thus the nonlinearity does not affect the B-UNCD nanowires PZR performance.

Figure 11:
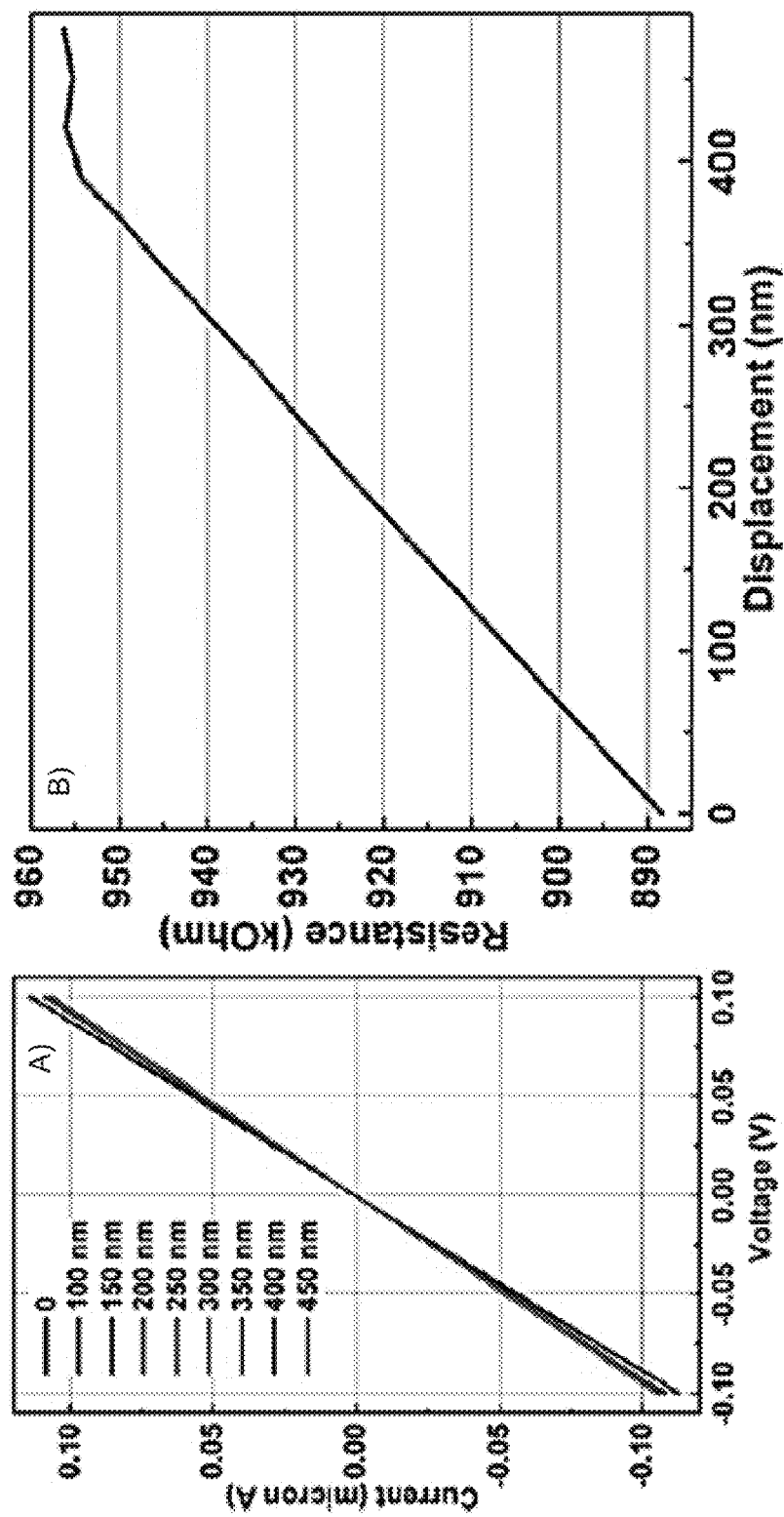
FIG. 11 panel A is an I-V plot of a force sensor that includes a 75 nm wide and 20 micron long B-UNCD nanowire under various displacements.

To establish the correlations between the strain and resistance change, the I-V plots were measured under different strains. FIG. 11 panel A shows the I-V curves of 75 nm wide, 20 microns long B-UNCD nanowires with transverse displacement increment of 50 nm. As shown in panel A, the slope of the I-V curves gradually decreases with the displacement, indicating that the B-UNCD nanowire has good electrical response to the stress. By calculating the resistance from FIG. 11 panel A, the correlation of the resistance vs. displacement up to 450 nm is plotted and shown in FIG. 11 panel B. The plot indicates that the resistance increases linearly with the transverse displacement until about 400 nm displacement of the B-UNCD nanowire. The results were reproducible with displacement smaller than 400 nm. The B-UNCD nanowire however broke at a displacement of about 450 nm. Thus, the B-UNCD nanowires provide a resilient and highly sensitive displacement or otherwise force sensor.

Figure 12:
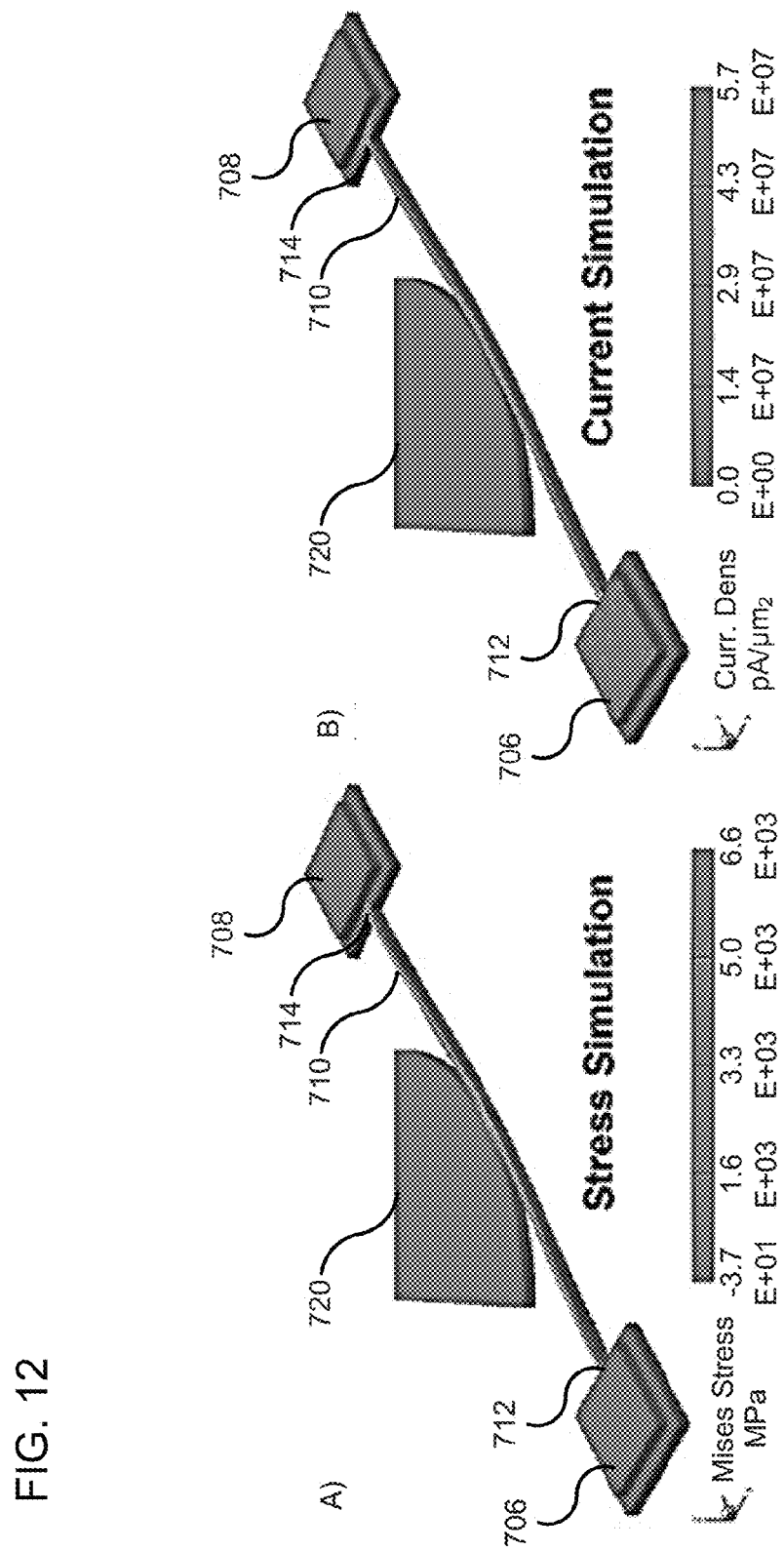
FIG. 12 panel A shows stress simulations and FIG. 12 panel shows current simulations performed on a finite element analysis (FEA) model of a B-UNCD nanowire that is 75 nm wide and 5 micron long, and is subjected to 100 nm transverse displacement.

FEA simulations were performed on models of B-UNCD nanowires to determine the relationship between PZR behavior with respect to B-UNCD nanowire length and width. FIG. 12 panel A shows FEA simulations of the stress experienced by a modeled B-UNCD nanowire 710 electrically coupled at a first end 712 to a first contact pad 706 and at a second end 714 to a second contact pad 708. Furthermore, the B-UNCD nanowire 710 is mechanically fixed at the first end 712 to the first contact pad 706, and at the second end 714 to the second contact pad 708. FIG. 12 panel B shows current simulations performed on the same B-UNCD nanowire 710. The B-UNCD nanowire 710 was 5 microns long and 75 nm wide. A transverse displacement of about 100 nm was applied on the B-UNCD nanowire 710 and the stress distribution as well as the electrical current density was measured. All FEA simulations were performed using COVENTERWARE™ software.

The FEA simulation results demonstrate that the B-UNCD nanowire 710 stress is higher at the first end 712 and the second end 714 where the B-UNCD nanowire 710 is anchored to the first contact pad 706 and the second contact pad 708, which is expected (FIG. 12 panel A). Furthermore, the current simulations (FIG. 12 panel B) demonstrate that the current density is distributed uniformly through the B-UNCD nanowire 710 which indicates a uniform electron transport under the PZR effect throughout the B-UNCD nanowire 710.

Figure 13:
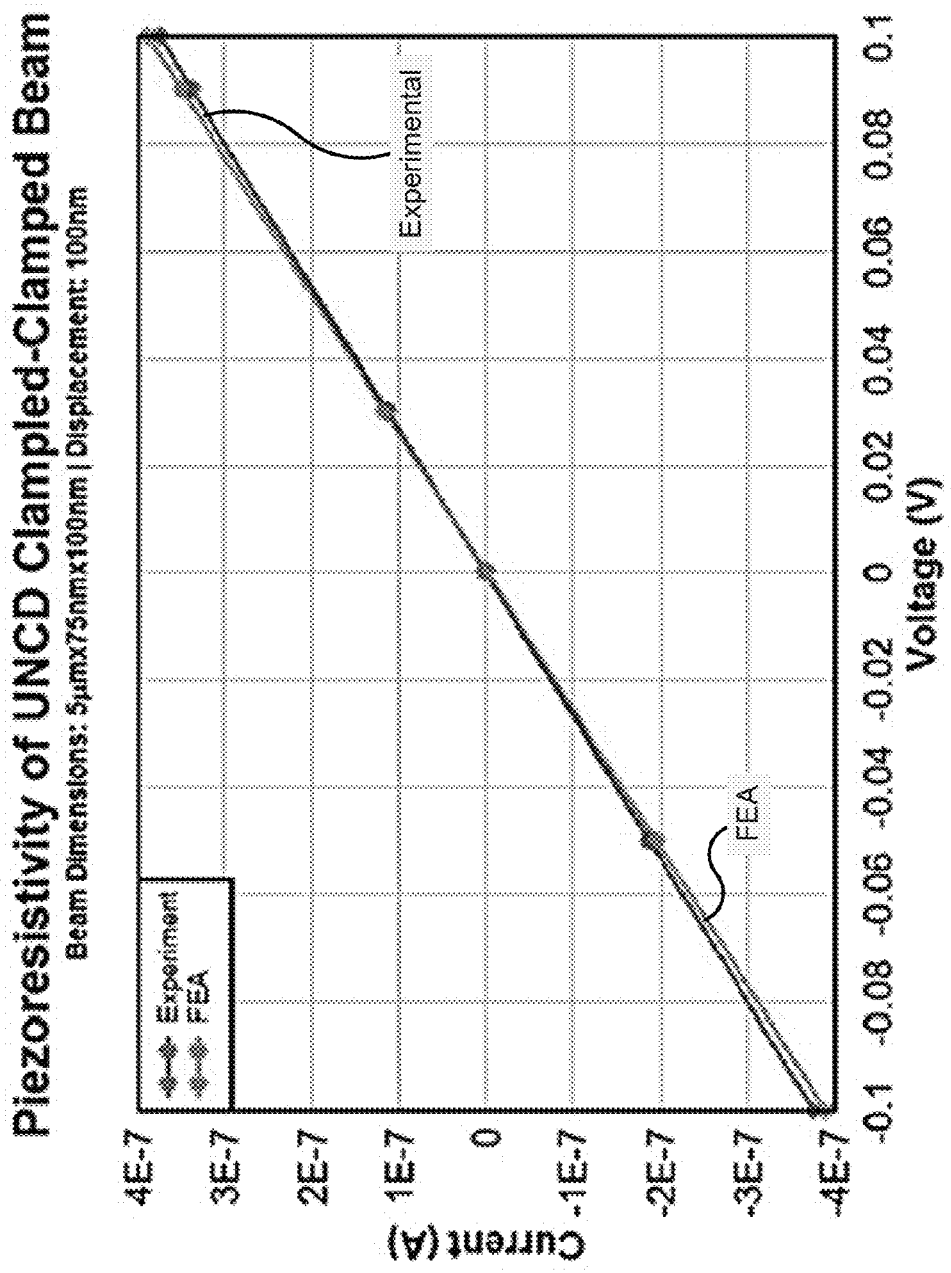
FIG. 13 shows an I-V plot obtained from the FEA modeling of the B-UNCD nanowire of FIG. 12 and experimental data obtained on a 75 nm wide and 5 micron long B-UNCD nanowire.

To evaluate the accuracy of the simulations, I-V measurements of the B-UNCD nanowire 710 were plotted and compared with an I-V plot obtained from experimental data, as shown in FIG. 13. FIG. 13 shows that the simulation result matches very well with the experimental data. The FEA simulated I-V characteristics are within 4% of the experimentally obtained values confirming that the experimental data from the PZR measurements were reliable and accurate.

Figure 14:
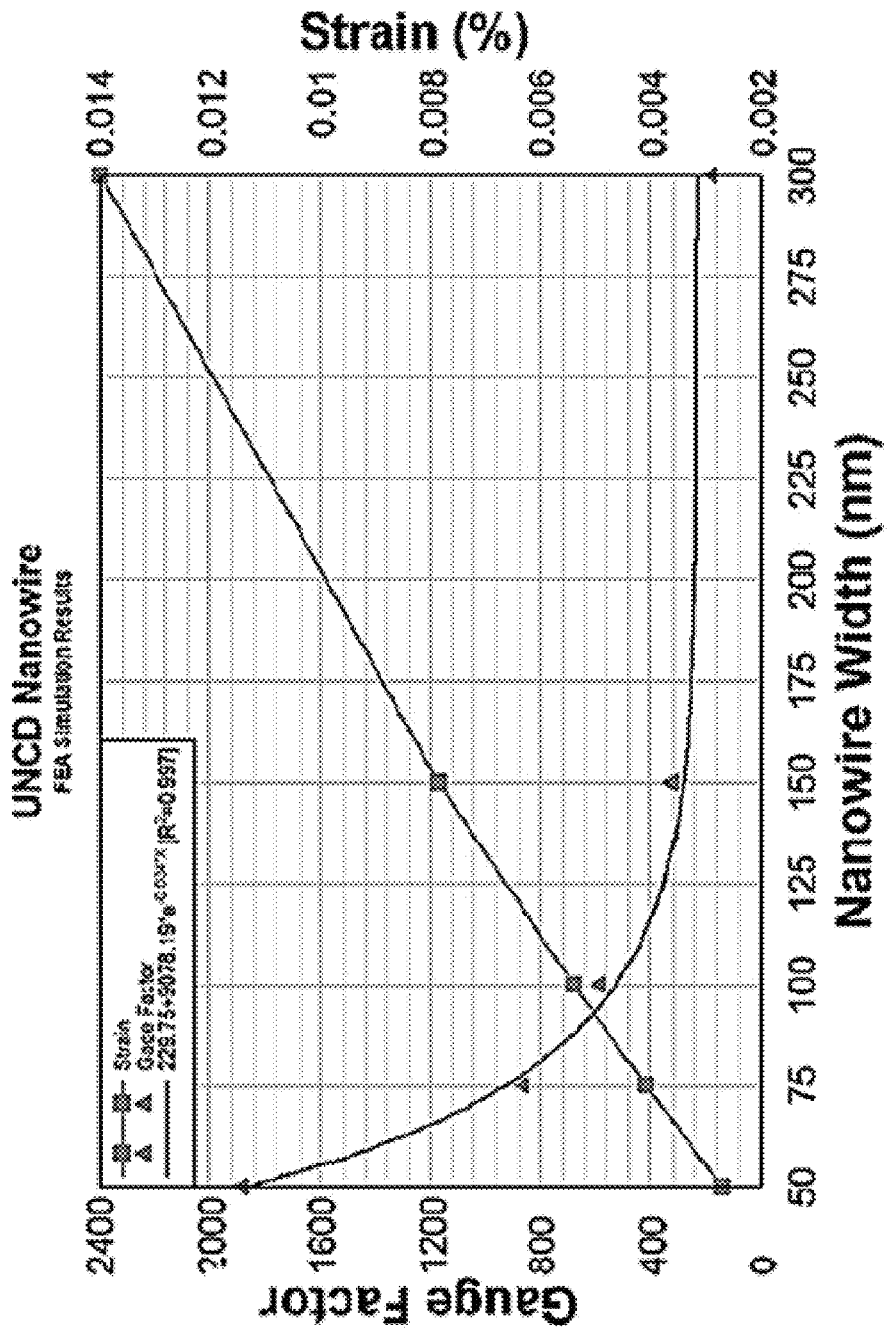
FIG. 14 is a plot of width and gauge factor obtained from FEA modeling of a B-UNCD nanowire having various widths.

As described herein, the gauge factor of B-UNCD nanowires is dependent upon the width of the nanowires. FIG. 14 shows a plot of gauge factor of B-UNCD nanowires as a function of B-UNCD nanowire width and strain. As the width of the B-UNCD nanowire scales down to 50 nm, the gauge factor of the B-UNCD NW can be higher than 1,800, given a small strain (≤0.003). This gauge factor is more than 200 times the gauge factor of a B-UNCD film. Thus, thinner B-UNCD nanowires can be used to develop nanoscale ultrasensitive displacement, pressure or otherwise force sensors. The physical mechanism of enhanced piezoresistivity with decrease in nanowire width can be visualized by assuming that the smaller width will induce higher concentration of stress and thus increasing gauge factor.

Transmission electron microscopy (TEM) and electron energy-loss spectra (EELS) studies were performed on B-UNCD films to study the mechanism behind the PZR effect of the B-UNCD nanowires. One obvious contrast of the PZR effect to the single crystalline Si nanowires is the existence of boron doping, which can be the potential cause of the PZR effect of diamond. In the case of microcrystalline diamond, the boron doping mechanism is already well established that the doping mechanism is substitutional. Although for NCD and UNCD, it is rather controversial whether the boron is mostly substitutional or resides at the grain boundary.

Figure 15:
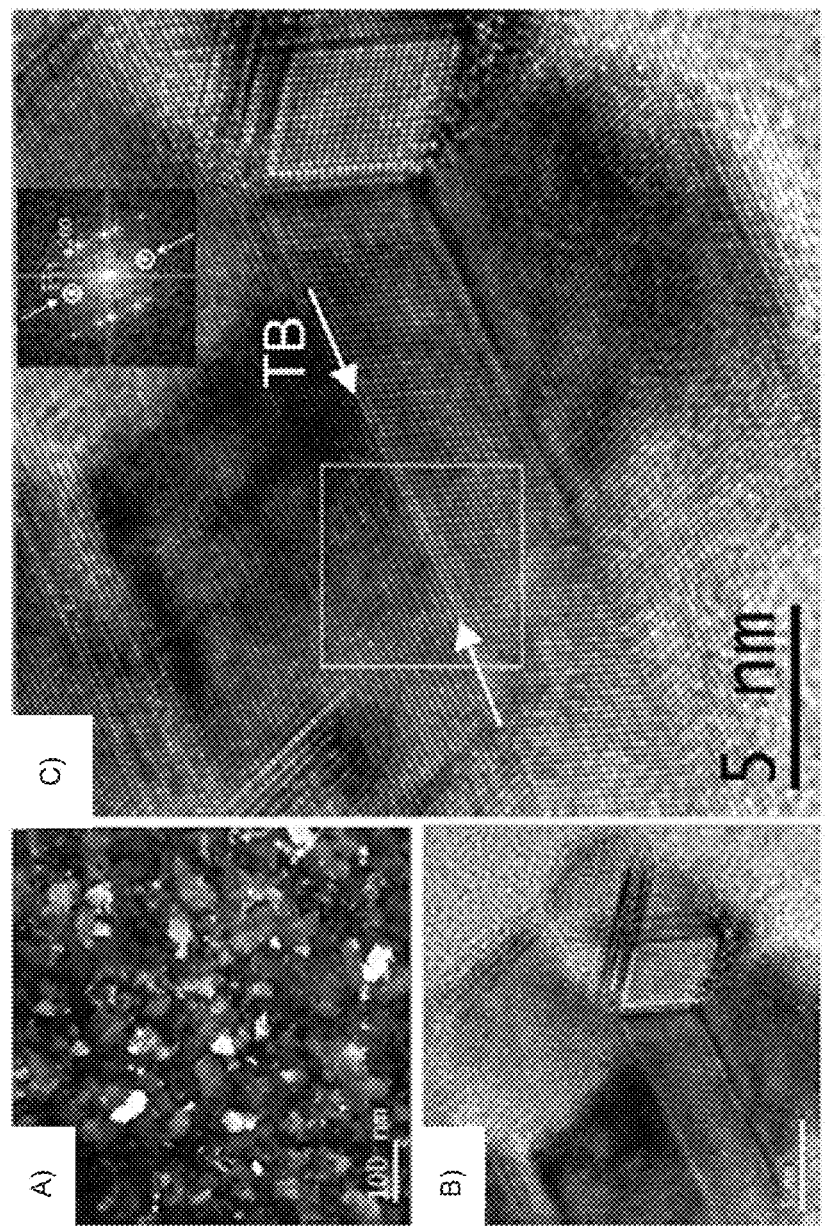
FIG. 15 panel A is a low magnification transmission electron microscopy (TEM) of a highly crystalline B-UNCD film with grain size in the range of about 20 nm to about 60 nm.

FIG. 15 panels A-C shows TEM images of a B-UNCD film. As observed from FIG. 15 panel A, nanoscale diamond grains are uniformly distributed in the B-UNCD film, with grain size ranges from 20-60 nm. FIG. 15 panel B shows a high resolution TEM (HRTEM) image of one of the diamond grains. Besides the high quality crystalline diamond structures, abundant structural defects are also seen in the image. This is caused by the substitutional doping of boron into the diamond grains. Such effect can also be better observed from the magnified HRTEM image which is shown in FIG. 15 panel C. The distinctive twin boundary is indicated in the white box between the white arrows. The inset selected area electron diffraction (SAED) pattern confirms the {111} mirror plane in the defect. The HRTEM and SAED information provides clear evidence of the crystalline structural defects in the B-UNCD film, which provides support for the substitutional boron doping mechanism. This mechanism suggests that the boron doping sites within the grains play active roles during the PZR measurements.

Figure 16:
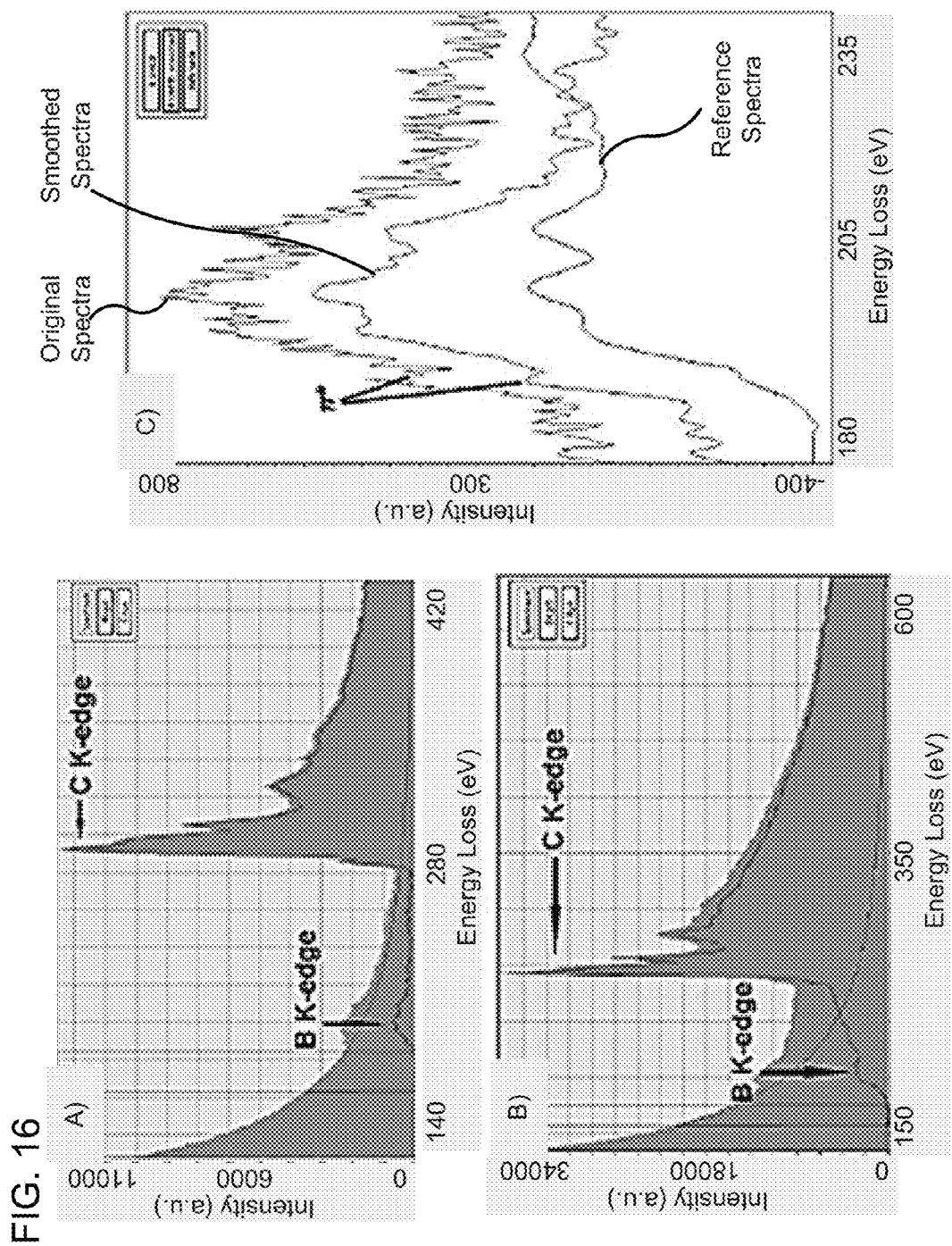
FIG. 16 panel A is an electron energy-loss spectra (EELS) spectra of a B-UNCD film that was performed on large area of the film that included a plurality of diamond grains.

FIG. 16 shows an EELS spectra of the B-UNCD film of FIG. 15. FIG. 16 panel A and panel B show the EELS spectra of the B-UNCD film that were performed on a broader area and a single diamond grain, respectively. Both EELS spectra show distinctive boron K-edge starting at 190 eV, which indicates the heavy amount of substitutional boron doping. A small $\pi^*$ peak at 285 eV is seen in panel A and is attributed to $sp^2$-bonded grain boundaries, which doesn't exist in the diamond crystals as shown panel B.

The energy loss near-edge fine structure (ELNES) of boron K-edge is presented in FIG. 16 panel C which shows an original spectra and a smoothed spectra of the boron K-edge structures. The reference spectra is the spectra of a boron K-edge structure that was taken on a reference diamond sample. The B-UNCDs boron K-edge structures show similar profiles as compared to the reference diamond sample, which confirms the substitutional boron doping behavior in the B-UNCD film. A small $\pi^*$ contribution points to boron embedded in $sp^2$-bonded carbon. The boron concentration calculated from the EELS is about $4.85 \times 10^{21}$ atoms per $cm^3$. This is higher than the metal-to-insulator transition concentration $3 \times 10^{20}$ atoms per $cm^3$.

From the TEM and EELS studies, it is observed that the boron is heavily doping into the UNCD grains, which generates abundant structural defects in the UNCD crystals. Such defects consequently result in the local strains within the UNCD grains. When external stress is applied, the structural deformation will transform the crystalline defects and lead to the change of internal strains within the grains, which will effectively alter the B-UNCDs Fermi level and the conductivity. In the case of B-UNCD nanowires the UNCD's volume is strictly limited in at least two dimensions. This results in stronger structural deformation under a given stress relative to a B-UNCD film. The transformation of the structural defects and internal strain is also enhanced as compared to the B-UNCD film. Therefore the electrical conductivity changes more aggressively, which results in a giant PZR effect of B-UNCD NW. Under such mechanism, the thinner the B-UNCD nanowire is, the higher the PZR effect will be, which is in absolute agreement with the simulation result.

As used herein, the singular forms "a", "an" and "the" include plural referents unless the context clearly dictates otherwise. Thus, for example, the term "a member" is intended to mean a single member or a combination of members, "a material" is intended to mean one or more materials, or a combination thereof.

It should be noted that the term "exemplary" as used herein to describe various embodiments is intended to indicate that such embodiments are possible examples, representations, and/or illustrations of possible embodiments (and such term is not intended to connote that such embodiments are necessarily extraordinary or superlative examples).

The terms "coupled," "connected," and the like as used herein mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

It is important to note that the construction and arrangement of the various exemplary embodiments are illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described herein. Other substitutions, modifications, changes and omissions may also be made in the design, operating conditions and arrangement of the various exemplary embodiments without departing from the scope of the present invention.

What is claimed is:

1. A method for preparing piezoresistive boron doped ultrananocrystalline diamond nanowires, comprising:
    depositing a metal layer on a boron doped ultrananocrystalline diamond film, the boron doped ultrananocrystalline film disposed on a sacrificial layer, the sacrificial layer disposed on a substrate;
    patterning the metal layer to form contact pads disposed on the boron doped ultrananocrystalline diamond film;
    depositing a first masking layer on the boron doped ultrananocrystalline diamond film;
    depositing a second masking layer over the first masking layer;
    patterning the first masking layer and the second masking layer to define an etch mask;
    etching the boron doped ultrananocrystalline diamond film to form boron doped ultrananocrystalline diamond nanowires; and
    wherein the boron doped ultrananocrystalline diamond nanowires have a gauge factor of at least about 70.

2. The method of claim 1, wherein the second masking layer is patterned using one of laser etching and electron beam lithography.

3. The method of claim 1, wherein the UNCD film is deposited over the sacrificial layer using hot filament chemical vapor deposition.

4. The method of claim 1, wherein the UNCD film is deposited over the sacrificial layer using microwave plasma deposition process.

5. The method of claim 1, wherein the UNCD film has a first thickness of about 20 nm to about 200 nm.

6. The method of claim 1, comprising depositing a UNCD film on the sacrificial layer and forming the boron doped ultrananocrystalline film disposed on a sacrificial layer.

7. The method of claim 6, wherein the boron is doped by exposing boron gas during UCND deposition on the sacrificial layer.

8. The method of claim 1, wherein the boron is doped by ex situ implantation into UNCD layer deposited on the sacrificial layer.

9. The method of claim 1, wherein boron concentration in the B-UNCD film is in the range of about $1\times10^{21}$ atoms per cm3 to about $9\times10^{21}$ atoms per cm3.

10. The method of claim 9, wherein the boron concentration in the B-UNCD films is about $4.8\times10^{21}$ atoms per cm3.

11. The method of claim 1, wherein the metal layer comprises at least one element selected from the group consisting of Cr, Ti, Pt, Au, or Cu.

12. The method of claim 11, wherein the metal layer comprises a plurality of elements selected from the group consisting of Cr, Ti, Pt, Au, or Cu.

13. The method of claim 12, wherein the metal layer comprises a Ti layer and a Pt layer, the Ti layer having a thickness of about 10 nm and the Pt layer having a thickness of about 100 nm.

14. The method of claim 1, further comprising etching the sacrificial layer below the boron doped ultrananocrystalline diamond nanowires to release the boron doped ultrananocrystalline diamond nanowires.

15. The method of claim 14, further comprising forming a wire having a width of about 20 nm to about 200 nm.

16. The method of claim 15, wherein forming the wire comprises forming the wire with a length of about 0.5 micron to about 25 micron.

17. The method of claim 15, wherein forming the wire comprises forming a wire having a gauge factor of about 70 to about 1,800.

\* \* \* \* \*